(12) United States Patent
Meura et al.

(10) Patent No.: US 8,389,328 B2
(45) Date of Patent: Mar. 5, 2013

(54) METHOD OF MANUFACTURING ELECTRONIC DEVICE AND ELECTRONIC DEVICE

(75) Inventors: Toru Meura, Tokyo (JP); Hiroki Nikaido, Tokyo (JP); Mina Nikaido, legal representative, Tokyo (JP); Kenzou Maejima, Tokyo (JP); Yoji Ishimura, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 14 days.

(21) Appl. No.: 13/127,770

(22) PCT Filed: Oct. 30, 2009

(86) PCT No.: PCT/JP2009/005770
§ 371 (c)(1),
(2), (4) Date: May 24, 2011

(87) PCT Pub. No.: WO2010/052871
PCT Pub. Date: May 14, 2010

(65) Prior Publication Data
US 2011/0221075 A1  Sep. 15, 2011

(30) Foreign Application Priority Data

Nov. 6, 2008 (JP) .................. 2008-285629
Dec. 5, 2008 (JP) .................. 2008-310853
Dec. 5, 2008 (JP) .................. 2008-310899

(51) Int. Cl.
*H01L 21/44* (2006.01)
*H01L 21/48* (2006.01)
*H01L 21/50* (2006.01)

(52) U.S. Cl. ........ 438/106; 428/112; 428/122; 428/127; 428/513; 257/E21.006; 257/E21.077; 257/E21.311; 257/E21.479; 257/E21.499; 257/E21.502; 257/E21.508; 257/E21.515

(58) Field of Classification Search .................. 438/106, 438/112, 122, 124, 126, 127, 509, 513, 612, 438/613; 257/E21.006, E21.077, E21.479, 257/E21.499, E21.502, E21.508, E21.311
See application file for complete search history.

(56) References Cited

U.S. PATENT DOCUMENTS 4,845,265 A * 7/1989 Lapin et al. .................... 560/84
6,180,696 B1 * 1/2001 Wong et al. ................... 523/457
6,617,046 B2  9/2003 Noro et al.

FOREIGN PATENT DOCUMENTS

| JP | 3-184695 A | 8/1991 |
|---|---|---|
| JP | 2001-311005 A | 11/2001 |
| JP | 2001-313312 A | 11/2001 |
| JP | 2002-241617 A | 8/2002 |
| JP | 2004-311709 A | 11/2004 |
| JP | 2005-307169 A | 11/2005 |

* cited by examiner

OTHER PUBLICATIONS

International Search Report dated Nov. 24, 2009 for PCT/JP2009/005770.

*Primary Examiner* — David Nhu
(74) *Attorney, Agent, or Firm* — Birch, Stewart, Kolasch & Birch, LLP

(57) ABSTRACT

Provided is a method of manufacturing an electronic device having a first electronic component having a first terminal and a second electronic component having a second terminal, wherein the first electric component is electrically connected to the second electronic component by connecting the first terminal to the second terminal with solder, the method including: providing a resin layer having a flux action between the first terminal and the second terminal to obtain a laminate including the first electronic component, the second electronic component, and the resin layer, wherein a solder is provided on the first terminal or the second terminal; soldering the first terminal and the second terminal; and curing the resin layer while pressing the laminate with a pressurized fluid.

10 Claims, 9 Drawing Sheets

US 8,389,328 B2

METHOD OF MANUFACTURING ELECTRONIC DEVICE AND ELECTRONIC DEVICE

This application is the National Phase under 35 U.S.C. §371 of International Application No. PCT/JP2009/005770 filed Oct. 30, 2009, which claims priority under 35 U.S.C. §119(a) to Japan Patent Application No. 2008-285629 filed Nov. 6, 2008; Japan Patent Application No. 2008-310853 filed Dec. 5, 2008; and Japan Patent Application No. 2008-310899 filed Dec. 5, 2008; all of which are hereby expressly incorporated by reference into the present application.

TECHNICAL FIELD

The present invention relates to a method of manufacturing an electronic device and an electronic device.

BACKGROUND ART

A semiconductor device is manufactured by performing a process of bonding a terminal of a support and a terminal of an adherend, for example, a terminal of a semiconductor element and a terminal of another semiconductor element, a terminal of a semiconductor element and a terminal of a substrate, or a terminal of a substrate and a terminal of another substrate with solder to electrically connect the support and the adherend.

In this case, since there is a gap between the support and the adherend after bonding with solder, it is necessary to fill the gap with a cured product of a resin. In the related art, after bonding with solder, a thermosetting resin with fluidity flows into the gap between the support and the adherend and the resin is cured to fill up the gap between the support and the adherend.

However, in recent years, the following method has been performed.

First, before bonding with solder, a resin layer with flux is arranged between the support and the adherend. Then, the resin layer is heated at a temperature equal to or more than the melting point of solder to perform soldering. In addition, the resin layer is cured to perform a soldering step and fill up the gap between the support and the adherend.

For example, Japanese Unexamined patent publication No. 3-184695 (Patent Document 1) discloses solder paste that has an epoxy resin as a main component and includes organic acid or organic acid salt and solder particles. Japanese Unexamined patent publication No. 2001-311005 (Patent Document 2) discloses a thermosetting resin sheet in which a composition including at least one kind of thermosetting resin selected from an epoxy-based resin, a phenol-based resin, a diallyl phthalate-based resin, and a benzocyclobutene-based resin and a flux component is formed in a sheet shape.

Patent Document 1: Japanese Laid-open Patent Publication No. 3-184695 (Claims)
Patent Document 2: Japanese Laid-open Patent Publication No. 2001-311005 (Claims)

DISCLOSURE OF THE INVENTION

However, when the techniques disclosed in Patent Document 1 and 2 are used, a void occurs in the cured product of the resin layer after curing.

According to the present invention, there is provided a method of manufacturing an electronic device comprising a first electronic component having a first terminal and a second electronic component having a second terminal, wherein said first electric component is electrically connected to said second electronic component by connecting said first terminal to said second terminal with solder, the method comprising, providing a resin layer having a flux action between said first terminal and said second terminal to obtain a laminate including said first electronic component, said second electronic component, and said resin layer, wherein a solder is provided on said first terminal or said second terminal, soldering said first terminal and said second terminal; and curing said resin layer while pressing said laminate with a pressurized fluid.

According to the present invention, after the soldering is performed, the curing of the resin layer may be performed. In addition, before the soldering is performed, the curing of the resin layer may be performed. The soldering and the curing of the resin layer may be performed at the same time.

According to the above-mentioned structure of the present invention, the laminate including the first electronic component, the second electronic component, and the resin layer is pressed by the pressurized fluid. Therefore, it is possible to provide a method of manufacturing an electronic device in which a void is less likely to occur in the cured product of the resin layer and connection reliability is high.

According to the present invention, a method of manufacturing an electronic device with high connection reliability is provided.

BRIEF DESCRIPTION OF THE DRAWINGS

The above and other objects, advantages and features of the present invention will be more apparent from the following description of certain preferred embodiments taken in conjunction with the accompanying drawings.

BEST MODE FOR CARRYING OUT THE INVENTION

Figure 1:
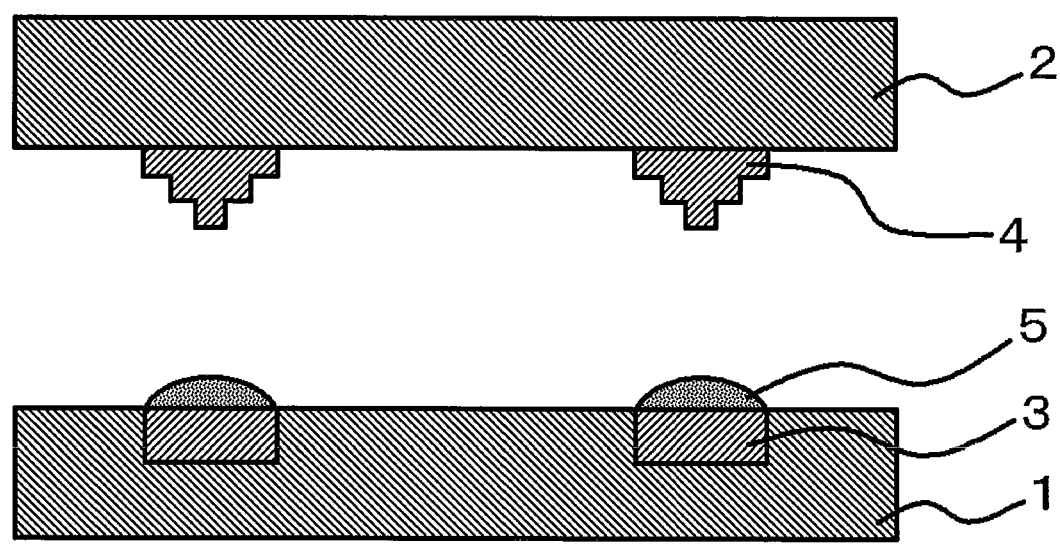
FIG. 1 is a cross-sectional view schematically illustrating an example of a method of manufacturing an electronic device according to a first embodiment of the present invention.

Hereinafter, exemplary embodiments of the present invention will be described with reference to the accompanying drawings.

First Embodiment

The outline of a method of manufacturing an electronic device according to the present invention will be described.

A method of manufacturing an electronic device according to the first embodiment bonds a first terminal 3 of a support 1 (first electronic component) and a second terminal 4 of an adherend (second electronic component) 2 with solder 5 to electrically connect the support 1 and the adherend 2. The method includes a step of arranging a resin layer 6 having a flux action between the first terminal 3 and the second terminal 4 to obtain a laminate including the support 1, the adherend 2, and the resin layer 6, a soldering step of soldering the first terminal 3 and the second terminal 4, and a pressing/curing step of curing the resin layer 6 while pressing the laminate with a pressurized fluid.

Next, the method of manufacturing an electronic device according to this embodiment will be described with reference to FIGS. 1 to 6.

In this embodiment, after the soldering step is performed, the pressing/curing step is performed.

In FIG. 1, the support 1 includes the first terminal 3 and the solder 5, and the solder 5 is formed on the first terminal 3 by plating. The adherend 2 includes the second terminal 4. In the subsequent step, the first terminal 3 and the second terminal 4 are bonded to each other by the solder 5 to electrically connect the support 1 and the adherend 2.

First, the surface of the support 1 on which the first terminal 3 and the solder 5 are formed is covered with the resin layer 6 having a flux action. In this way, the resin layer 6 is arranged between the first terminal 3 and the second terminal 4 (resin layer arranging step).

Figure 2:
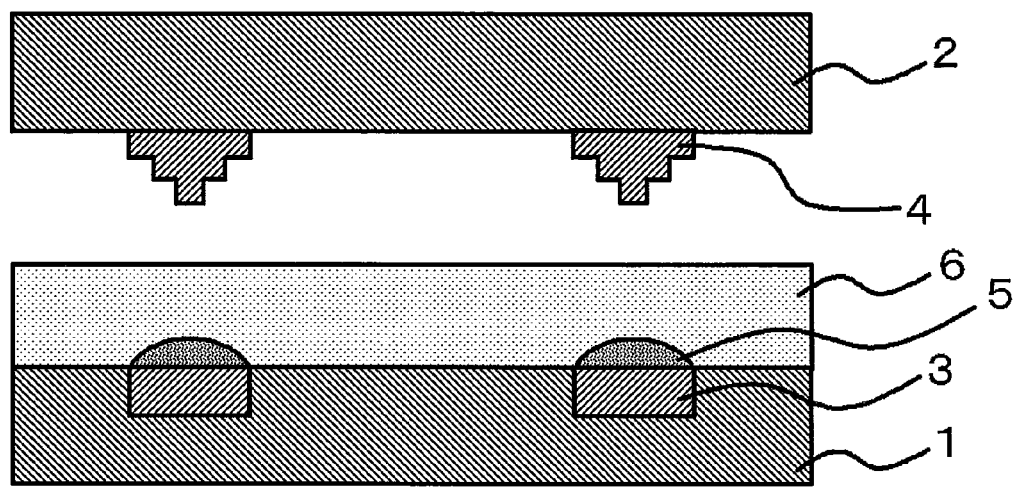
FIG. 2 is a cross-sectional view schematically illustrating an example of the method of manufacturing an electronic device according to the first embodiment of the present invention.
Figure 3:
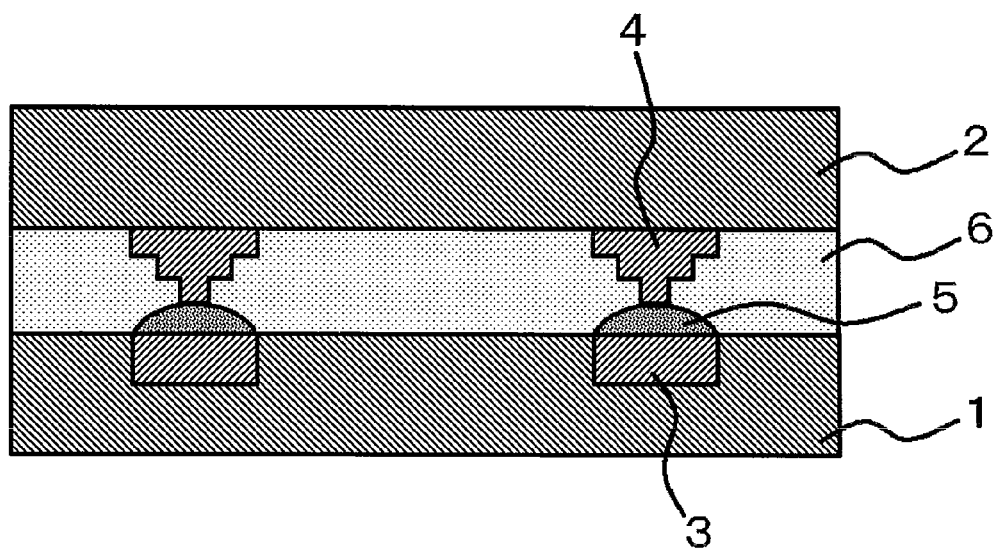
FIG. 3 is a cross-sectional view schematically illustrating an example of the method of manufacturing an electronic device according to the first embodiment of the present invention.

Then, as shown in FIG. 2, the adherend is aligned such that the second terminal 4 is disposed above the first terminal 3. Then, as shown in FIG. 3, the distance between the support 1 and the adherend 2 is adjusted such that the second terminal 4 is stuck into the resin layer 6 and the leading end of the second terminal 4 contacts the solder 5 (aligning step).

Figure 4:
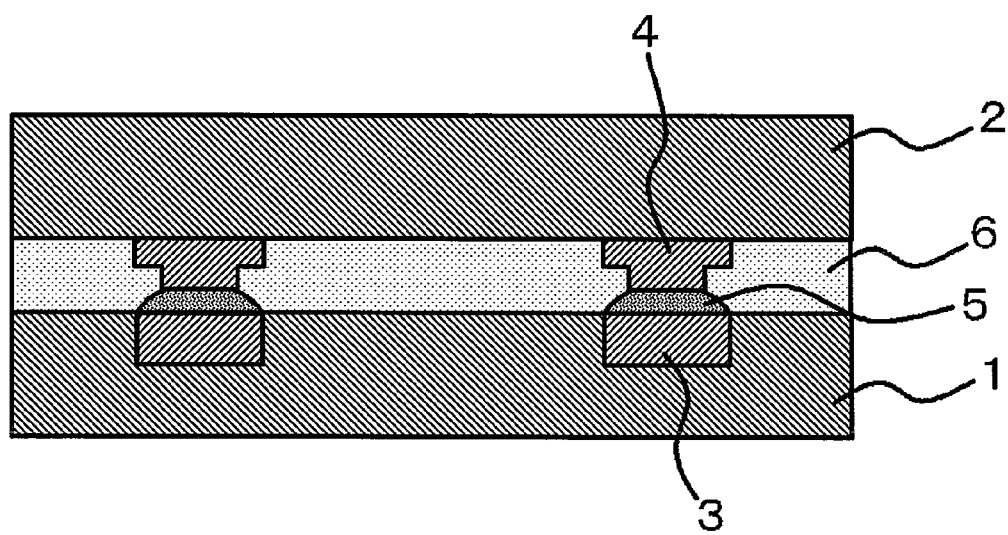
FIG. 4 is a cross-sectional view schematically illustrating an example of the method of manufacturing an electronic device according to the first embodiment of the present invention.

Then, the support 1, the adherend 2, and the resin layer 6 are heated at a temperature equal to or more than the melting point of the solder 5. Then, the solder 5 is melted, the distance between the first terminal 3 and the second terminal 4 is reduced, and a bonding portion is formed between the first terminal 3 and the second terminal 4, thereby performing soldering (FIG. 4). In this way, the first terminal 3 and the second terminal 4 are bonded to each other by the solder 5 (soldering step).

Figure 5:
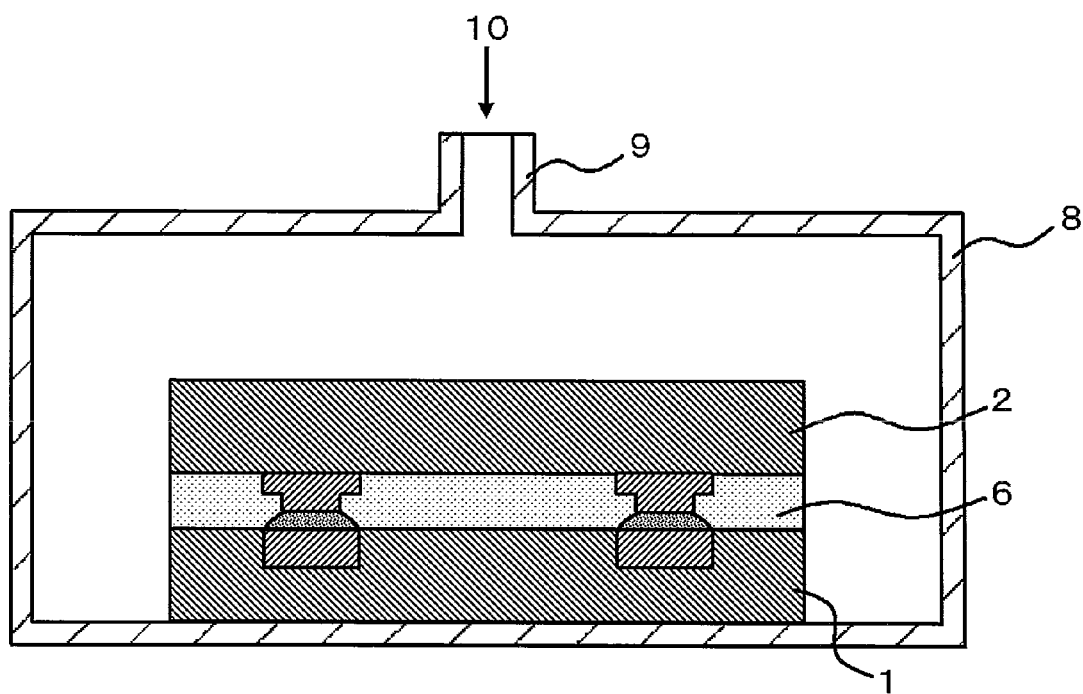
FIG. 5 is a cross-sectional view schematically illustrating an example of the method of manufacturing an electronic device according to the first embodiment of the present invention.
Figure 6:
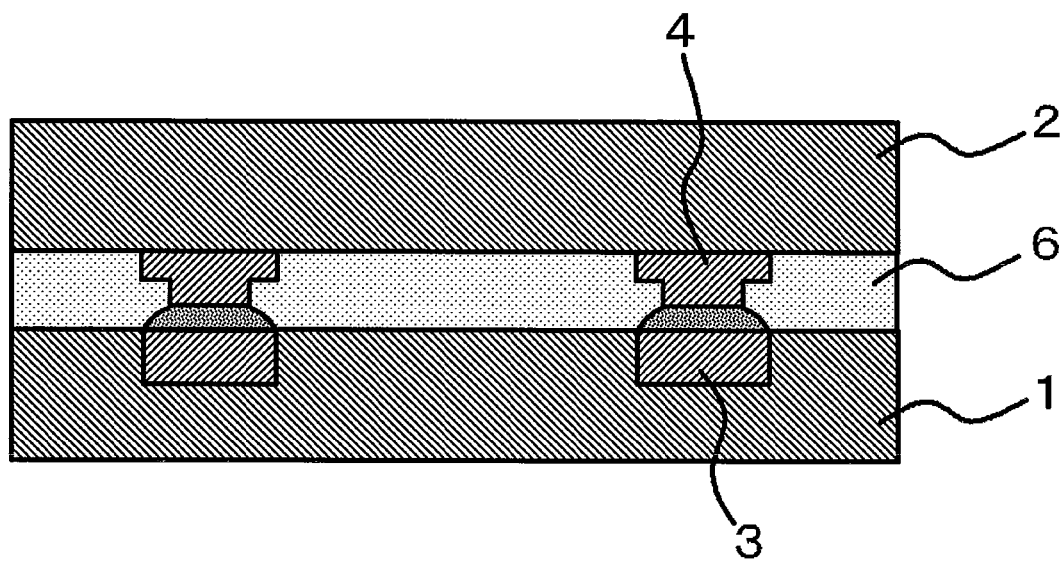
FIG. 6 is a cross-sectional view schematically illustrating an example of the method of manufacturing an electronic device according to the first embodiment of the present invention.

Then, as shown in FIG. 5, the support 1, the adherend 2, and the resin layer 6 are placed in a heating oven (vessel) 8 and a pressurized fluid 10 is introduced into the heating oven through a pressurized fluid feed port 9. Then, the support 1, the adherend 2, and the resin layer 6 are heated at a temperature equal to or more than the curing temperature of the resin layer 6 while pressure is applied to the inside of the heating oven 8 by the pressurized fluid 10, that is, while a laminate of the support 1, the adherend 2, and the resin layer 6 is pressed with the pressurized fluid 10, thereby curing the resin layer 6 (pressing/curing step). In this way, as shown in FIG. 6, the resin layer becomes a cured product of the resin layer 6, and the first terminal 3 and the second terminal 4 are bonded to each other by the solder 5. In addition, the gap between the support 1 and the adherend 2 is filled up with the cured product of the resin layer 6.

The laminate is heated by a heater provided in the heating oven 8.

As such, the method of manufacturing an electronic device according to the first embodiment of the present invention sequentially performs the resin layer arranging step, the alignment step, the soldering step, and the pressing/curing step as a step of bonding the first terminal 3 of the support 1 and the second terminal 4 of the adherend 2 using the solder 5 to electrically connect the support 1 and the adherend 2.

In the method of manufacturing an electronic device according to the first embodiment of the present invention, combinations of the support 1 and the adherend 2 shown in Table 1 are given as an example.

TABLE 1

| Support | Adherend |
|---|---|
| Substrate | Semiconductor chip |
| Substrate | Substrate |
| Semiconductor chip | Semiconductor chip |
| Wafer having semiconductor element mounted thereon | Semiconductor chip |
| Wafer having semiconductor element mounted thereon | Wafer having semiconductor element mounted thereon |

For example, a flexible substrate, a rigid substrate, or a ceramic substrate is used as the support 1 or the adherend 2.

In the method of manufacturing an electronic device according to the first embodiment of the present invention, the support 1 includes the first terminal 3. The shape of the first terminal 3 is not particularly limited, but the first terminal 3 may have any shape as long as soldering can be performed in the soldering step. For example, the first terminal 3 may have a convex shape or a concave shape. The material forming the first terminal 3 is not particularly limited, but the first terminal 3 may be made of, for example, gold, copper, nickel, palladium, or aluminum.

In the method of manufacturing an electronic device according to the first embodiment of the present invention, the adherend 2 includes the second terminal 4. The shape of the second terminal 4 is not particularly limited, but the second terminal 4 may have any shape as long as soldering can be performed in the soldering step. For example, the second terminal 4 may have a convex shape or a concave shape. The material forming the second terminal 4 is not particularly limited, but the second terminal 4 may be made of, for example, gold, copper, nickel, palladium, or aluminum.

In the method of manufacturing an electronic device according to the first embodiment of the present invention, the solder 5 used to bond the first terminal 3 and the second terminal 4 is not particularly limited, but may be made of, for example, an alloy including at least two selected from a group consisting of tin, silver, lead, zinc, bismuth, indium, and copper. It is preferable that the second terminal be made of an alloy including at least two selected from a group consisting of tin, silver, lead, zinc, and copper among the above-mentioned materials. In the method of manufacturing an electronic device according to the first embodiment of the present invention, the melting point of the solder is in the range of 110° C. to 250° C. and preferably in the range of 170° C. to 230° C.

In the example shown in FIGS. 1 to 6, the solder 5 is a solder layer that is formed on the terminal by plating. However, in the method of manufacturing an electronic device according to the first embodiment of the present invention, the solder 5 may be, for example, a solder ball or a solder bump formed with solder paste.

In the example shown in FIGS. 1 to 6, the solder 5 is provided on the first terminal 3. However, the solder 5 may be provided on the second terminal 4, or the solder 5 may be provided on each of the first terminal 3 and the second terminal 4.

In the example shown in FIGS. 1 to 6, the number of first terminals 3 and the number of second terminals 4 are two. However, in the method of manufacturing an electronic device according to the first embodiment of the present invention, the number of first terminals 3 and the number of second terminals 4 are not particularly limited.

In the resin layer arranging step of the method of manufacturing an electronic device according to the first embodiment of the present invention, the resin layer 6 having a flux action is arranged between the first terminal 3 and the second terminal 4 which are bonded to each other by the solder 5.

In the resin layer arranging step, the material forming the resin layer 6 having a flux action is not particularly limited, but the resin layer 6 is made of a thermosetting resin composition that is used to fill up the gap between the support 1 and the adherend 2 in the manufacture of a semiconductor device.

In the resin layer arranging step, the minimum melt viscosity of the resin layer 6 having a flux action at a temperature of 100° C. to 200° C. is preferably in the range of 1 Pa·s to 10000 Pa·s, more preferably in the range of 1 Pa·s to 1000 Pa·s, and most preferably in the range of 1 Pa·s to 500 Pa·s. When the minimum melt viscosity of the resin layer 6 having a flux action at a temperature of 100° C. to 200° C. is equal to or more than 1 Pa·s, it is possible to prevent the occurrence of a void in the resin layer 6.

On the other hand, when the minimum melt viscosity of the resin layer 6 having a flux action at a temperature of 100° C. to 200° C. is equal to or less than 10000 Pa·s, the resin composition forming the resin layer 6 flows to fill up the void formed in the resin layer 6. In this way, it is possible to prevent the occurrence of a void in the cured product of the resin layer 6.

The minimum melt viscosity is measured by, for example, a rheometer, which is a viscoelasticity measuring device, by applying a shear frequency of 1 Hz to a film-shaped sample at a rate of temperature increase of 10° C./minute.

In the resin layer arranging step, the resin layer 6 having a flux action has a function of removing an oxide film on the surface of the solder 5 during soldering. Since the resin layer 6 has a flux action, the oxide film covering the surface of the solder 5 is removed in the soldering step, which makes it possible to perform soldering. Since the resin layer 6 has a flux action, the resin layer 6 needs to include a compound having a flux action. The compound that has a flux action and is included in the resin layer 6 is not particularly limited, but any compound may be used as long as it can be used for soldering. A compound including one or both of a carboxyl group and phenolic hydroxyl group is preferable.

The content of the compound having a flux action in the resin layer 6 is preferably in the range of 1 to 30% by weight and more preferably in the range of 3 to 20% by weight. When the content of the compound having a flux action in the resin layer 6 is in the above-mentioned range, it is possible to improve the flux activity of the resin layer 6 and prevent a compound having a flux action which does not react with a thermosetting resin from remaining in the resin layer 6. In addition, when the compound having a flux action which does not react with the thermosetting resin remains, a migration occurs.

In addition, examples of the compound which acts as a curing agent for a thermosetting resin include compounds having a flux action (which is also referred to as a flux-active curing agent). For example, a phenol novolac resin, a cresol novolac resin, an aliphatic dicarboxylic acid, and an aromatic dicarboxylic acid which act as a curing agent for an epoxy resin, also have a flux action. In the present invention, the resin layer 6 containing such a flux-active curing agent which may act not only as a flux but also as a curing agent for a thermosetting resin as a curing agent for a thermosetting resin is a resin layer having a flux action.

Moreover, the compound having a flux action, which contains a carboxyl group, refers to a compound in which at least one carboxyl group is present in a molecule, and it may be either liquid or solid. Further, the compound having a flux action, which contains a phenolic hydroxyl group, refers to a compound in which at least one phenolic hydroxyl group is present in a molecule, and it may be either liquid or solid. Also, the compound having a flux action, which contains a carboxyl group and a phenolic hydroxyl group, refers to a compound in which at least one carboxyl group and at least one phenolic hydroxyl group are present in a molecule, and it may be either liquid or solid.

Among them, examples of the compound having a flux action, which contains a carboxyl group, include an aliphatic acid anhydride, an alicyclic acid anhydride, an aromatic acid anhydride, an aliphatic carboxylic acid, and an aromatic carboxylic acid.

Examples of the aliphatic acid anhydrides relating to the compound having a flux action, which contains a carboxyl group, include anhydrous succinic acid, polyadipic anhydride, polyazelaic anhydride, and polysebacic anhydride.

Examples of the alicyclic acid anhydride relating to the compound having a flux action, which contains a carboxyl group, include methyltetrahydrophthalic anhydride, methylhexahydrophthalic anhydride, methylhimic anhydride, hexahydrophthalic anhydride, tetrahydrophthalic anhydride, trialkyltetrahydrophthalic anhydride, and methylcyclohexenedicarboxylic acid anhydride.

Examples of the aromatic acid anhydride relating to the compound having a flux action, which contains a carboxyl group, include phthalic anhydride, trimellitic anhydride, pyromellitic anhydride, benzophenone tetracarboxylic anhydride, ethylene glycol bistrimellitate, and glycerin trimellitate.

Examples of the aliphatic carboxylic acid relating to the compound having a flux action, which contains a carboxyl group, include a compound represented by the following General formula 1, formic acid, acetic acid, propionic acid, butyric acid, valeric acid, caproic acid, pivalic acid, caprylic acid, lauric acid, myristic acid, palmitic acid, stearic acid, acrylic acid, methacrylic acid, crotonic acid, oleic acid, fumaric acid, maleic acid, oxalic acid, malonic acid, and succinic acid:

$$HOOC-(CH_2)_n-COOH \qquad (1)$$

(In General formula I, n represents an integer equal to or more than 0 and equal to or less than 20).

Examples of the aromatic carboxylic acid relating to the compound having a flux action, which contains a carboxyl group, include benzoic acid, phthalic acid, isophthalic acid, terephthalic acid, hemimellitic acid, trimellitic acid, trimesic acid, mellophanic acid, prehnitic acid, pyromellitic acid, mellitic acid, tolic acid, xylic acid, hemellitic acid, mesitylene acid, prehnitylic acid, toluic acid, cinnamic acid, salicylic acid, 2,3-dihydroxybenzoic acid, 2,4-dihydroxybenzoic acid, gentisic acid (2,5-dihydroxybenzoic acid), 2,6-dihydroxybenzoic acid, 3,5-dihydroxybenzoic acid, gallic acid (3,4,5-trihydroxybenzoic acid), naphthoic acid derivatives such as 1,4-dihydroxy-2-naphthoic acid, and 3,5-dihydroxy-2-naphthoic acid, phenolphthalin, and diphenolic acid.

Among the compounds having a flux action, which contains a carboxyl group, the compound represented by General formula 1 is preferable from the viewpoints of good balance among the activity degree of the compound having a flux action, the amount of the generated outgases during curing of the resin layer, the elastic modulus of the resin layer after curing, and the glass transition temperature. Further, among the compounds represented by General formula 1, the compound of General formula 1 in which n is 3 to 10 is particularly preferable from the viewpoints that increase in the elastic modulus in the resin layer after curing can be suppressed and the adhesiveness of an adherend 2 to a support 1 can be improved.

Examples of the compound represented by General formula 1 in which n is 3 to 10 include glutaric acid with n=3 (HOOC—(CH$_2$)$_3$—COOH), adipic acid with n=4 (HOOC—(CH$_2$)$_4$—COOH), pimelic acid with n=5 (HOOC—(CH$_2$)$_5$—COOH), sebacic acid with n=8 (HOOC—(CH$_2$)$_8$—COOH), and HOOC—(CH$_2$)$_{10}$—COOH with n=10.

Examples of the compound having a flux action containing a phenolic hydroxyl group include phenols, and specific examples thereof include monomers containing a phenolic hydroxyl group including phenol, o-cresol, 2,6-xylenol, p-cresol, m-cresol, o-ethylphenol, 2,4-xylenol, 2,5-xylenol, m-ethylphenol, 2,3-xylenol, mesitol, 3,5-xylenol, p-tert-butylphenol, catechol, p-tert-amylphenol, resorcinol, p-octylphenol, p-phenylphenol, bisphenol A, bisphenol F, bisphenol AF, biphenol, diallylbisphenol F, diallylbisphenol A, trisphenol, and tetrakisphenol, phenol novolac resins, o-cresol novolac resins, bisphenol F novolac resins, and bisphenol A novolac resins.

The compounds containing either a carboxyl group or a phenolic hydroxyl group, or both of a carboxyl group and a phenolic hydroxyl group, as described above, is incorporated three-dimensionally in a reaction with a thermosetting resin such as an epoxy resin.

For this reason, as the compound having a flux action, a compound having a flux action as well as acting as a curing agent for the epoxy resin, that is, a flux-active curing agent is preferred from the viewpoints of improving the formation of a three-dimensional network of the epoxy resin after curing. Examples of the flux-active curing agent include a compound having at least two phenolic hydroxyl groups capable of being added to the epoxy resin and at least one carboxyl group directly attached to an aromatic moiety exhibiting a flux action (reduction action) in one molecule. Examples of the flux-active curing agent include benzoic acid derivatives such as 2,3-dihydroxybenzoic acid, 2,4-dihydroxybenzoic acid, gentisic acid (2,5-dihydroxybenzoic acid), 2,6-dihydroxybenzoic acid, 3,4-dihydroxybenzoic acid, and gallic acid (3,4,5-trihydroxybenzoic acid); naphthoic acid derivatives such as 1,4-dihydroxy-2-naphthoic acid, 3,5-dihydroxy-2-naphthoic acid, and 3,7-dihydroxy-2-naphthoic acid; phenolphthalin; and diphenol acid. These may be used singly or in combination of two or more kinds thereof.

Among these, from the viewpoints of bond reliability and film formability during formation of the film-shaped resin layer 6, phenolphthalein is preferable.

Further, the blending amount of the flux-active curing agent in the resin layer 6 having a flux action is preferably 1 to 30% by weight, and more preferably 3 to 20% by weight. When the blending amount of the flux-active curing agent in the resin layer is within the ranges above, the flux activity of the resin layer 6 can be improved, and the thermosetting resin and the unreacted flux-active curing agent are prevented from remaining in the resin layer 6. In addition, if the unreacted flux-active curing agent remains, it is possible that migration occurs.

The thickness of the resin layer 6 having a flux action is appropriately selected on the basis of the distance between the support 1 and the adherend 2 after the soldering step is performed.

In the example shown in FIGS. 1 to 6, the resin layer 6 covers the surface of the support 1 to be arranged between the first terminal 3 and the second terminal 4. In the method of manufacturing an electronic device according to the first embodiment of the present invention, the resin layer 6 may cover the surface of the adherend 2 to be arranged between the first terminal 3 and the second terminal 4.

In the resin layer arranging step, as a method of arranging the resin layer 6 having a flux action between the first terminal 3 and the second terminal 4, for example, the following methods may be used:

1. A method of preparing a film-shaped resin film made of a resin composition including a compound having a flux action and laminating the resin film on the support 1 or the adherend 2;

2. A method of preparing a liquid resin composition including a compound having a flux action and coating the surface of the support 1 or the adherend 2 with the liquid resin composition; and 3. A method of preparing resin varnish in which a resin composition including a compound having a flux action is dissolved or dispersed in a solvent, coating the surface of the support 1 or the adherend 2 with the resin varnish, and volatilizing the solvent in the resin varnish.

The liquid resin composition in Method 2 does not include a solvent.

In the method of manufacturing an electronic device according to the first embodiment of the present invention, the alignment step aligns the positions of the first terminal 3 and the second terminal 4 which are bonded to each other by the solder 5 in the planar direction (in FIG. 2, the left-right direction and the front-rear direction of the plane of FIG. 2).

In the example shown in FIGS. 1 to 6, after the first terminal 3 and the second terminal 4 are aligned so as to face each other, the distance between the support 1 and the adherend 2 is adjusted such that the second terminal 4 is stuck into the resin layer 6 and the leading end of the second terminal 4 contacts the solder 5. However, in the alignment step of the method of manufacturing an electronic device according to the first embodiment of the present invention, the first terminal and the second terminal to be bonded to each other may be aligned in the planar direction in any way. Therefore, the first terminal and the second terminal are not necessarily brought into contact with each other, but the first terminal and the second terminal may be separated from each other.

In the alignment step of the method of manufacturing an electronic device according to the first embodiment of the present invention, when the second terminal 4 is stuck into the resin layer 6 after the alignment, the second terminal 4 may be stuck into the resin layer 6 while the support 1, the adherend 2, and the resin layer 6 are heated at a temperature of 50° C. to 150° C.

The soldering step of the method of manufacturing an electronic device according to the first embodiment of the present invention is the following step:

(1-I) The support 1, the adherend 2, and the resin layer 6 are heated at a temperature equal to or more than the temperature at which the first terminal 3 and the second terminal 4 can be soldered, without the second terminal 4 being brought into contact with the solder 5. Then, the distance between the first terminal 3 and the second terminal 4 is reduced and the first terminal 3 and the second terminal 4 are bonded to each other by the solder 5; or (1-II) The first terminal 3 and the second terminal 4 contact each other with the solder 5 interposed therebetween and the support 1, the adherend 2, and the resin layer 6 are heated at a temperature equal to or more than the temperature at which the first terminal 3 and the second terminal 4 can be soldered, thereby bonding the first terminal 3 and the second terminal 4 with the solder 5.

In (1-II), the support 1, the adherend 2, and the resin layer 6 may be pressed by, for example, a pressing plate with the first terminal 3 being brought into contact with the second terminal 4 such that the distance between the first terminal 3 and the second terminal 4 is reduced.

In the soldering step, the heating temperature of the support 1, the adherend 2, and the resin layer 6 may be equal to or more than the temperature at which the first terminal 3 and the second terminal 4 can be soldered and is appropriately selected depending on the metal materials forming the solder 5 and the terminals 3 and 4. In general, the heating temperature is in the range of 110° C. to 250° C. and preferably in the range of 170° C. to 230° C. In the soldering step, the heating time of the laminate including the support 1, the adherend 2, and the resin layer 6 is appropriately selected depending on the kind of solder 5. The heating time is generally in the range of 1 second to 120 seconds and preferably in the range of 1 second to 30 seconds.

The metal material forming the terminals is diffused into the solder to form an alloy even at a temperature less than the melting point of the solder 5, depending on a combination of the metal materials forming the solder 5 and the terminals 3 and 4. Therefore, it is possible to bond the first terminal 3 and the second terminal 4 with solder. Next, the temperature equal to or more than the temperature at which the first terminal 3 and the second terminal 4 can be soldered and the combination of the metal materials forming the solder 5 and the terminals 3 and 4 will be described.

(a) When the solder 5 is provided on each of the first terminal 3 and the second terminal 4, the solder 5 is melted to bond the terminals. Therefore, in order to perform soldering regardless of the kind of metal materials forming the solder 5 and the terminals 3 and 4, the support 1, the adherend 2, and the resin layer 6 need to be heated at a temperature equal to or more than the melting point of the solder. Therefore, in the case of (a), the temperature equal to or more than the temperature at which the first terminal 3 and the second terminal 4 can be soldered is equal to or more than the melting point of the solder.

(b) In a structure in which the solder 5 is provided on only one of the first terminal 3 and the second terminal 4 and the solder 5 is not provided on the other terminal, when the metal material forming the terminal on which the solder 5 is not provided does not form an alloy with the solder at a temperature less than the melting point of the solder, the support 1, the adherend 2, and the resin layer 6 need to be heated at a temperature equal to or more than the melting point of the solder 5 in order to perform soldering. Therefore, in the case of (b), the temperature equal to or more than the temperature at which the first terminal 3 and the second terminal 4 can be soldered is equal to or more than the melting point of the solder 5. As an example of (b), when the first copper terminal plated with solder (melting point: 221° C.) including tin 96.5/silver 3.5 and the second copper terminal that is not plated with the solder are bonded to each other, the solder including tin 96.5/silver 3.5 and copper do not form an alloy of the solder including tin 96.5/silver 3.5 and copper at a temperature less than the melting point of the solder including tin 96.5/silver 3.5. Therefore, the temperature equal to or more than the temperature at which the first terminal 3 and the second terminal 4 can be soldered is equal to or more than the melting point of the solder including tin 96.5/silver 3.5.

(c) In a structure in which the solder 5 is provided on only one of the first terminal 3 and the second terminal 4 and the solder 5 is not provided on the other terminal, when the metal material forming the terminal on which the solder 5 is not provided is diffused into the solder and forms an alloy with the solder at a temperature less than the melting point of the solder 5, soldering can be performed even when the support 1, the adherend 2, and the resin layer 6 are heated at a temperature less than the melting point of the solder 5. Therefore, in the case of (c), the temperature equal to or more than the temperature at which the first terminal 3 and the second terminal 4 can be soldered is equal to or more than a temperature at which the metal material forming the terminal on which the solder 5 is not provided is diffused into the solder and forms an alloy with the solder. As an example of (c), when the first copper terminal plated with solder (melting point: 221° C.) including tin 96.5/silver 3.5 and the second gold terminal that is not plated with the solder are bonded to each other, gold is diffused into the solder including tin 96.5/silver 3.5 and an alloy of gold and the solder including tin 96.5/silver 3.5 and copper is formed at a temperature less than the melting point of the solder including tin 96.5/silver 3.5. Therefore, the temperature equal to or more than the temperature at which the first terminal 3 and the second terminal 4 can be soldered is equal to or more than a temperature at which gold is diffused into the solder including tin 96.5/silver 3.5 and an alloy of gold and the solder including tin 96.5/silver 3.5 and copper is formed. When the first copper terminal 3 plated with solder including tin 96.5/silver 3.5 and the second gold terminal 4 that is not plated with the solder are bonded to each other, gold is diffused into the solder 5 at a temperature of about 25° C., and soldering can be performed. However, it is preferable that the support 1, the adherend 2, and the resin layer 6 be heated at a temperature of 110° C. to 250° C. during soldering, considering the bonding time.

In the soldering step, when the combination of the metal materials forming the solder 5 and the terminals 3 and 4 is (a) or (b), (1-I) the distance between the first terminal 3 and the second terminal 4 is reduced while the support 1, the adherend 2, and the resin layer 6 are heated at a temperature equal to or more than the temperature at which the first terminal 3 and the second terminal 4 can be soldered, that is, a temperature equal to or more than the melting point of the solder. In this case, the distance between the support 1 and the adherend 2 is reduced and thus the distance between the first terminal 3 and the second terminal 4 is reduced. However, since the resin layer 6 that has not been cured is provided between the support 1 and the adherend 2, the distance between the support 1 and adherend 2 is reduced while the resin layer 6 is compressed in the vertical direction. As a result, the distance between the first terminal 3 and the second terminal 4 is reduced. In this case, the compression pressure applied to the resin layer 6 is in the range of 0.01 MPa to 10 MPa and preferably in the range of 0.05 MPa to 5 MPa. The compression pressure applied to the resin layer 6 is the load of the resin layer 6, which is a compressed portion, per unit area.

In the soldering step, in a case in which the combination of the metal materials forming the solder and the terminals is (c), when the first terminal 3 and the second terminal 4 contact each other with the solder 5 interposed therebetween in the alignment step, (1-II) the support 1, the adherend 2, and the resin layer 6 are heated at a temperature equal to or more than the temperature at which the first terminal 3 and the second terminal 4 can be soldered and then the metal material forming the terminal on which the solder is not provided is diffused into the solder to form an alloy. Therefore, it is possible to perform soldering without reducing the distance between the first terminal 3 and the second terminal 4. For example, it is possible to perform soldering by heating the support, the adherend, and the resin layer with a solder reflow apparatus that does not compress the resin layer 6. In the soldering step, when the combination of the metal materials forming the solder and the terminals is (c), (1-I) the distance between the first terminal 3 and the second terminal 4 is reduced while the support 1, the adherend 2, and the resin layer 6 are heated at a temperature equal to or more than the melting point of the solder 5, thereby performing soldering. When the combination of the metal materials forming the solder and the terminals is (c), in the soldering step, soldering is performed by the method (1-II) to prevent the warping of the support. Therefore, a void is less likely to occur in the cured product. When soldering is performed by the method (1-I), it is possible to reliably perform soldering. Therefore, when the combination of the metal materials forming the solder and the terminals is (c), in the soldering step, it is possible to appropriately select a soldering method.

When the heating temperature in the soldering step is more than the curing temperature of the resin layer 6, a portion of the resin layer 6 is cured in the soldering step.

In the method of manufacturing an electronic device according to the first embodiment of the present invention, the pressing/curing step heats the laminate including the support 1, the adherend 2, and the resin layer 6 at a temperature equal to or more than the curing temperature of the resin layer 6 while pressing the laminate including the support 1, the adherend 2, and the resin layer 6 with a pressurized fluid, thereby curing the resin layer 6.

Since the pressure of the atmosphere of the laminate including the support 1, the adherend 2, and the resin layer 6 is higher than atmospheric pressure by a value corresponding to pressing force, the laminate including the support 1, the adherend 2, and the resin layer 6 is directly and uniformly pressed from at least the upper side and both side surfaces of the laminate by the pressurized fluid.

In the pressing/curing step, the pressurized fluid means a fluid used to press the laminate and is not particularly limited. For example, the pressurized fluid is preferably gas, such as nitrogen gas, argon gas, or air, and more preferably air in terms of costs. In addition, in the pressing/curing step, a liquid may be used as the pressurized fluid.

In the pressing/curing step, the pressing force of the pressurized fluid against the laminate including the support 1, the adherend 2, and the resin layer 6, that is, the internal pressure of the heating oven shown in FIG. 5 is in the range of 0.1 MPa to 10 MPa and more preferably in the range of 0.5 MPa to 5 MPa. In the pressing/curing step, when the pressing force of the pressurized fluid against the laminate including the support 1, the adherend 2, and the resin layer 6 is equal to or more than 0.1 MPa, it is possible to destroy the void in the resin layer 6 with the pressing force so as to be buried in the resin layer 6 even when the void is formed in the resin layer 6. As a result, a void is less likely to occur in the cured product of the resin layer 6. In addition, it is possible to prevent the occurrence of a void in the resin layer 6.

On the other hand, when the pressing force of the pressurized fluid against the laminate including the support 1, the adherend 2, and the resin layer 6 is equal to or less than 10 MPa, it is possible to prevent an increase in the size of an apparatus for pressing the laminate, for example, the heating oven shown in FIG. 5 and prevent the structure of the apparatus from being complicated.

In the specification, pressing with the pressurized fluid means increasing the pressure of the atmosphere of the laminate including the support 1, the adherend 2, and the resin layer 6 to be higher than atmospheric pressure by a value corresponding to the pressing force.

That is, a pressing force of 10 MPa means that the pressure applied to the laminate is 10 MPa more than atmospheric pressure.

In the pressing/curing step, the laminate including the support 1, the adherend 2, and the resin layer 6 may be heated at a temperature equal to or more than the curing temperature of the resin layer 6. The heating temperature of the laminate is appropriately selected. The heating temperature is generally in the range of 100° C. to 250° C. and preferably in the range of 150° C. to 200° C. In the pressing/curing step, the heating time of the laminate including the support 1, the adherend 2, and the resin layer 6 is appropriately selected depending on the kind of resin layer 6. The heating time is generally in the range of 0.5 hours to 3 hours and preferably in the range of 1 hour to 2 hours.

In the pressing/curing step, as a method of curing the resin layer 6 while pressing the laminate with the pressurized fluid, for example, the following method may be used: a method of placing an object to be heated (in the pressing/curing step, the laminate including the support 1, the adherend 2, and the resin layer 6) in a pressure vessel, introducing a pressurized fluid into the pressure vessel (vessel) to increase the internal pressure of the pressure vessel to be higher than atmospheric pressure, and heating the object while pressing the laminate with the pressurized fluid, specifically, a method of placing an object in a heating oven, introducing gas into the heating oven to increase the internal pressure of the heating oven to be higher than atmospheric pressure, and heating the object using the heating oven while pressing the laminate with the gas.

The curing rate of the cured product of the resin layer 6 obtained in the pressing/curing step is preferably equal to or more than 80% and more preferably in the range of 90% to 100%. The curing rate of the cured product of the resin layer 6 obtained in the pressing/curing step is adjusted by appropriately selecting the heating temperature and the heating time in the soldering step and the pressing/curing step. In the method of manufacturing an electronic device according to the first embodiment of the present invention, the curing rate of the cured product of the resin layer 6 obtained in the pressing/curing step is calculated as follows.

(i) The resin layer 6 (that is, the resin layer arranged between the first terminal 3 and the second terminal 4 in the resin layer arranging step) that has not been subjected to a heating process is heated by a differential scanning calorimeter (DSC) under the measurement conditions of a measurement temperature range of 25° C. to 300° C. and a rate of temperature increase of 10° C./minute, and the amount A1 of heat generated at that time is measured. (ii) The resin layer 6 having the same heat history (the heating temperature and the heating time) as that in the soldering step and the pressing/ curing step is prepared and is heated by the same measurement method, and the amount B1 of heat generated at that time is measured.

(iii) A curing rate C1 (%) is calculated by the following Expression 2:

$$C1(\%)=\{(A1-B1)/A1\}\times 100 \qquad (2)$$

Second Embodiment

Next, a method of manufacturing an electronic component according to a second embodiment of the present invention will be described.

The method of manufacturing an electronic device according to the second embodiment of the present invention bonds a first terminal 3 of a support 1 and a second terminal 4 of an adherend 2 using solder 5 to electrically connect the support 1 and the adherend 2. The method of manufacturing an electronic device sequentially performs a resin layer arranging step of arranging a resin layer 6 having a flux action between the first terminal 3 and the second terminal 4 to be bonded to each other, an alignment step of aligning the first terminal 3 and the second terminal 4 to be bonded to each other, a pressing/curing step of curing the resin layer 6 while pressing the support and the adherend with a pressurized fluid, and a soldering step of bonding the first terminal 3 and the second terminal 4 with the solder.

Figure 7:
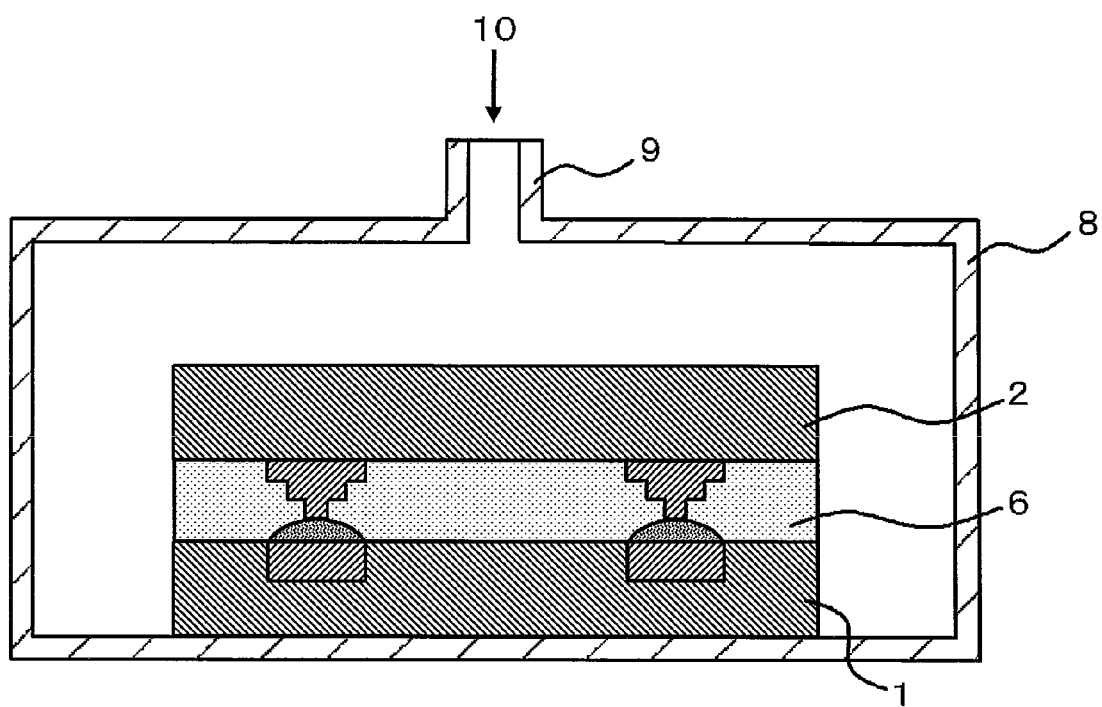
FIG. 7 is a cross-sectional view schematically illustrating an example of a pressing/curing step and a soldering step in a method of manufacturing an electronic device according to a second embodiment of the present invention.
Figure 8:
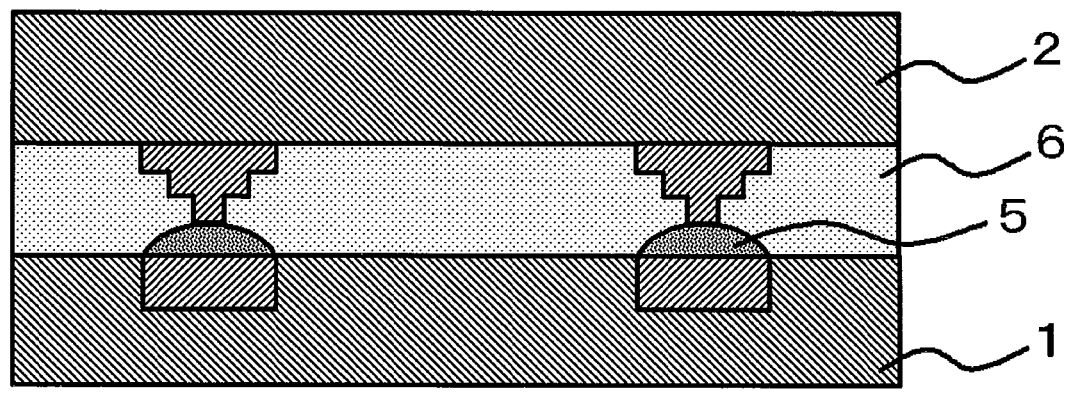
FIG. 8 is a cross-sectional view schematically illustrating an example of the pressing/curing step and the soldering step in the method of manufacturing an electronic device according to the second embodiment of the present invention.
Figure 9:
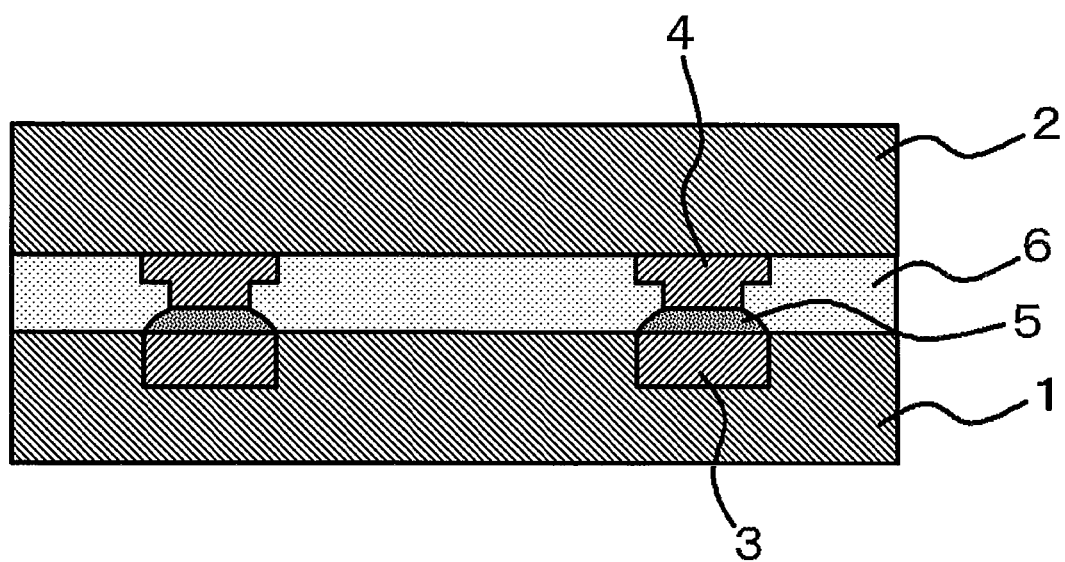
FIG. 9 is a cross-sectional view schematically illustrating an example of the pressing/curing step and the soldering step in the method of manufacturing an electronic device according to the second embodiment of the present invention.

In the method of manufacturing an electronic device according to the second embodiment of the present invention, the support 1, the first terminal 3, the adherend 2, the second terminal 4, the solder 5, the resin layer 6 having a flux action, the resin layer arranging step, and the alignment step are the same as the support 1, the first terminal 3, the adherend 2, the second terminal 4, the solder 5, the resin layer 6 having a flux action, the resin layer arranging step, and the alignment step in the method of manufacturing an electronic device according to the first embodiment of the present invention, and a description thereof will not be repeated. The pressing/curing step and the soldering step of the method of manufacturing an electronic device according to the second embodiment of the present invention will be described below with reference to FIGS. 7 to 9. FIGS. 7 to 9 are cross-sectional views schematically illustrating modifications of the pressing/curing step and the soldering step of the method of manufacturing an electronic device according to the second embodiment of the present invention.

As shown in FIG. 7, after the resin layer arranging step and the alignment step are performed, the support 1, the adherend 2, and the resin layer 6 are placed in a heating oven 8 and a pressurized fluid 10 is introduced into the heating oven through a pressurized fluid feed port 9 to press the inside of the heating oven 8 with the pressurized fluid 10. Then, the support 1, the adherend 2, and the resin layer 6 are heated at a temperature equal to or more than the curing temperature of the resin layer 6, thereby curing the resin layer 6 (pressing/curing step). In this way, the resin layer 6 is cured and becomes a cured product of the resin layer (FIG. 8).

Then, as shown in FIG. 9, the distance between the first terminal 3 and the second terminal 4 is reduced while the support 1, the adherend 2, and the cured product of the resin layer 6 are heated at a temperature equal to or more than the melting point of the solder 5, and a bonding portion is formed between the first terminal 3 and the second terminal 4, thereby performing soldering. In this way, the first terminal 3 and the second terminal 4 are bonded to each other by solder (soldering step). In the soldering step, since the cured product of the resin layer 6 is heated at a temperature equal to or more than the melting point of the solder 5, the cured product of the resin layer 6 is further cured depending on a curing rate or a heating temperature.

As such, the method of manufacturing an electronic device according to the second embodiment of the present invention sequentially performs the resin layer arranging step, the alignment step, the pressing/curing step, and the soldering step as a step of bonding the first terminal 3 of the support 1 and the second terminal 4 of the adherend 2 using the solder 5 to electrically connect the support 1 and the adherend 2.

In the method of manufacturing an electronic device according to the second embodiment of the present invention, the pressing/curing step heats the support 1, the adherend 2, and the resin layer 6 at a temperature equal to or more than the curing temperature of the resin layer 6 while pressing the support 1, the adherend 2, and the resin layer 6 with the pressurized fluid to cure a portion of the resin layer 6 or the entire resin layer 6. In this way, the resin layer 6 is cured.

The curing rate of the cured product of the resin layer 6 obtained in the pressing/curing step is appropriately selected depending on the heating temperature and the heating time in the soldering step or depending on whether to perform a non-pressing/curing step, which will be described below, after the soldering step. When the non-pressing/curing step, which will be described below, is performed after the soldering step, the curing rate of the cured product of the resin layer 6 obtained in the pressing/curing step is preferably in the range of 1% to 90%, more preferably in the range of 5% to 60%, and most preferably in the range of 10% to 50%. When the non-pressing/curing step, which will be described below, is not performed after the soldering step, the curing rate of the cured product of the resin layer 6 obtained in the pressing/curing step is preferably equal to or more than 80% and more preferably in the range of 90% to 100%. In the pressing/curing step, it is possible to adjust the curing rate of the cured product of the resin layer 6 obtained in the pressing/curing step by appropriately selecting the heating temperature and heating time of the support 1, the adherend 2, and the resin layer 6. In the method of manufacturing an electronic device according to the second embodiment of the present invention, the curing rate of the cured product of the resin layer 6 obtained in the pressing/curing step is calculated as follows.

(i) The resin layer 6 (that is, the resin layer 6 arranged between the first terminal 3 and the second terminal 4 in the resin layer arranging step) that has not been subjected to a heating process is heated by a differential scanning calorimeter (DSC) under the measurement conditions of a measurement temperature range of 25° C. to 300° C. and a rate of temperature increase of 10° C./minute, and the amount A2 of heat generated at that time is measured. (ii) The resin layer 6 having the same heat history (the heating temperature and the heating time) as that in the pressing/curing step is prepared and is heated by the same measurement method, and the amount B2 of heat generated at that time is measured.

(iii) A curing rate C2(%) is calculated by the following Expression 3:

$$C2(\%)=\{(A2-B2)/A2\}\times 100 \qquad (3)$$

In the pressing/curing step, as described above, the heating temperature and the heating time of the support 1, the adherend 2, and the resin layer 6 are appropriately selected depending on the curing rate of the cured product of the resin layer 6. The heating temperature may be equal to or more than the curing temperature of the resin layer 6. The heating temperature is generally in the range of 100° C. to 250° C. and preferably in the range of 150° C. to 200° C. The heating time is generally in the range of 0.5 minutes to 180 minutes, preferably in the range of 0.5 minutes to 60 minutes, and more preferably in the range of 1 minute to 30 minutes.

The pressurized fluid used in the pressing/curing step is the same as that used in the pressing/curing step according to the first embodiment.

In the pressing/curing step, the pressing force of the pressurized fluid against the laminate including the support 1, the adherend 2, and the resin layer 6 is in the range of 0.1 MPa to 10 MPa and preferably in the range of 0.5 MPa to 5 MPa. In the pressing/curing step, when the pressing force of the pressurized fluid against the laminate including the support 1, the adherend 2, and the resin layer 6 is equal to or more than 0.1 MPa, it is possible to destroy a void in the resin layer 6 with the pressing force so as to be buried in the resin layer 6 even when the void is formed in the resin layer 6. As a result, a void is less likely to occur in the cured product of the resin layer 6. In addition, it is possible to prevent the occurrence of a void in the resin layer 6.

On the other hand, when the pressing force of the pressurized fluid against the laminate including the support 1, the adherend 2, and the resin layer 6 is equal to or less than 10 MPa, it is possible to prevent an increase in the size of an apparatus for pressing the laminate, for example, the heating oven shown in FIG. 5 and prevent the structure of the apparatus from being complicated.

In the pressing/curing step, a method of curing the resin layer 6 while pressing the laminate with the pressurized fluid is the same as the method of curing the resin layer 6 while pressing the laminate with the pressurized fluid in the pressing/curing step according to the first embodiment.

The soldering step of the method of manufacturing an electronic device according to the second embodiment of the present invention is the following step:

(2-I) The distance between the first terminal 3 and the second terminal 4 is reduced while the laminate including the support 1, the adherend 2, and the cured product of the resin layer 6 cured in the pressing/curing step is heated at a temperature equal to or more than the temperature at which the first terminal 3 and the second terminal 4 can be soldered, without the second terminal 4 being brought into contact with the solder 5, thereby bonding the first terminal 3 and the second terminal 4 with the solder 5; or (2-II) The first terminal 3 and the second terminal 4 contact each other with the solder 5 interposed therebetween and the laminate including the support 1, the adherend 2, and the cured product of the resin layer 6 cured in the pressing/curing step are heated at a temperature equal to or more than the temperature at which the first terminal 3 and the second terminal 4 can be soldered, thereby bonding the first terminal 3 and the second terminal 4 with the solder 5.

In (2-II), the support 1, the adherend 2, and the resin layer 6 may be pressed by, for example, a pressing plate with the first terminal 3 being brought into contact with the second terminal 4 such that the distance between the first terminal 3 and the second terminal 4 is further reduced.

In the following description, in the soldering step, the temperature equal to or more than the temperature at which the first terminal 3 and the second terminal 4 can be soldered and combinations (a), (b) and (c) of the metal materials forming the solder 5 and the terminals are the same as those in the soldering step according to the first embodiment.

In the soldering step, the heating temperature of the support 1, the adherend 2, and the cured product of the resin layer 6 cured in the pressing/curing step is equal to or more than the temperature at which the first terminal 3 and the second terminal 4 can be soldered and is appropriately selected in the range in which the curing rate of the cured product of the resin layer 6 after the soldering step is equal to or more than a target value. The heating temperature is generally in the range of 110° C. to 250° C. and preferably in the range of 170° C. to 230° C. In the soldering step, the heating time of the support 1, the adherend 2, and the cured product of the resin layer 6 cured in the pressing/curing step is appropriately selected depending on the kind of solder 5 and in the range in which the curing rate of the cured product of the resin layer 6 obtained in the soldering step is equal to or more than a target value. The heating time is generally in the range of 1 second to 20 minutes and preferably in the range of 60 seconds to 15 minutes.

In the soldering step, when the combination of the metal materials forming the solder 5 and the terminals is (a) or (b), (2-I) the distance between the first terminal 3 and the second terminal 4 is reduced while the support 1, the adherend 2, and the cured product of the resin layer 6 cured in the pressing/curing step are heated at a temperature equal to or more than the temperature at which the first terminal 3 and the second terminal 4 can be soldered, that is, a temperature equal to or more than the melting point of the solder. In this case, the distance between the support 1 and the adherend 2 is reduced and thus the distance between the first terminal 3 and the second terminal 4 is reduced. However, since the cured product of the resin layer 6 cured in the pressing/curing step is provided between the support 1 and the adherend 2, the distance between the support 1 and adherend 2 is reduced while the cured product of the resin layer 6 cured in the pressing/curing step is compressed in the vertical direction. As a result, the distance between the first terminal 3 and the second terminal 4 is reduced. In this case, the compression pressure applied to the cured product of the resin layer 6 cured in the pressing/curing step is in the range of 0.01 MPa to 10 MPa and preferably in the range of 0.05 MPa to 5 MPa. The compression pressure applied to the resin layer 6 is the load of the resin layer 6, which is a compressed portion, per unit area.

In the soldering step, in a case in which the combination of the metal materials forming the solder and the terminals is (c), when the first terminal 3 and the second terminal 4 contact each other with the solder 5 interposed therebetween in the alignment step, (2-II) the support 1, the adherend 2, and the cured product of the resin layer 6 cured in the pressing/curing step are heated at a temperature equal to or more than the temperature at which the first terminal 3 and the second terminal 4 can be soldered and then the metal material forming the terminal on which the solder is not provided is diffused into the solder 5 to form an alloy. Therefore, it is possible to perform soldering without reducing the distance between the first terminal 3 and the second terminal 4. For example, it is possible to perform soldering by heating the support, the adherend, and the resin layer with a solder reflow apparatus that does not compress the cured product of the resin layer 6. In the soldering step, when the combination of the metal materials forming the solder 5 and the terminals is (c), (2-I) the distance between the first terminal 3 and the second terminal 4 is reduced while the support 1, the adherend 2, and the cured product of the resin layer 6 cured in the pressing/curing step are heated at a temperature equal to or more than melting point of the solder 5, thereby performing soldering. When the combination of the metal materials forming the solder 5 and the terminals is (c), in the soldering step, soldering is performed by the method (2-II) to prevent the warping of the support 1. Therefore, a void is less likely to be formed in the cured product. When soldering is performed by the method (2-I), it is possible to reliably perform soldering. Therefore, when the combination of the metal materials forming the solder 5 and the terminals is (c), in the soldering step, it is possible to appropriately select a soldering method.

The curing rate of the cured product of the resin layer 6 obtained in the soldering step is preferably equal to or more than 30% and more preferably equal to or more than 60%. In the method of manufacturing an electronic device according to the second embodiment of the present invention, the curing rate of the cured product of the resin layer 6 obtained in the soldering step is calculated as follows.

(i) The resin layer 6 (that is, the resin layer 6 arranged between the first terminal 3 and the second terminal 4 in the resin layer arranging step) that has not been subjected to a heating process is heated by a differential scanning calorimeter (DSC) under the measurement conditions of a measurement temperature range of 25° C. to 300° C. and a rate of temperature increase of 10° C./minute, and the amount A3 of heat generated at that time is measured.

(ii) The resin layer 6 having the same heat history (the heating temperature and the heating time) as that in the pressing/curing step and the soldering step is prepared and is heated by the same measurement method, and the amount B3 of heat generated at that time is measured.

(iii) A curing rate C3 (%) is calculated by the following Expression 4:

$$C3(\%)=\{(A3-B3)/A3\}\times 100 \quad (4)$$

In the method of manufacturing an electronic device according to the second embodiment of the present invention, after the soldering step, a non-pressing/curing step of heating a non-cured portion of the cured product of the resin layer 6 obtained in the soldering step in a non-pressurized atmosphere, such as at an atmospheric pressure, to be cured, thereby increasing the curing rate of the cured product of the resin layer 6 can be performed, if needed. Preferably, it is possible to increase the curing rate of the cured product of the resin layer 6 to be equal or more than 90%.

Third Embodiment

A method of manufacturing an electronic device according to a third embodiment of the present invention bonds a first terminal 3 of a support 1 and a second terminal 4 of an adherend 2 using solder 5 to electrically connect the support 1 and the adherend 2. The method of manufacturing an electronic device sequentially performs a resin layer arranging step of arranging a resin layer 6 having a flux action between the first terminal 3 and the second terminal 4 to be bonded to each other, an alignment step of aligning the first terminal 3 and the second terminal 4 to be bonded to each other, a first pressing/curing step of curing the resin layer 6 while pressing the support and the adherend with a pressurized fluid, a soldering step of bonding the first terminal 3 and the second terminal 4 with the solder, and a second pressing/curing step of curing the resin layer 6 cured in the first pressing/curing step while pressing the support and the adherend with the pressurized fluid.

In the method of manufacturing an electronic device according to the third embodiment of the present invention, the support 1, the first terminal 3, the adherend 2, the second terminal 4, the solder 5, the resin layer 6 having a flux action, the resin layer arranging step, and the alignment step are the same as the support 1, the first terminal 3, the adherend 2, the second terminal 4, the solder 5, the resin layer 6 having a flux action, the resin layer arranging step, and the alignment step in the method of manufacturing an electronic device according to the first embodiment of the present invention, and a description thereof will not be repeated. The first pressing/curing step, the soldering step, and the second pressing/curing step of the method of manufacturing an electronic device according to the third embodiment of the present invention will be described below.

The method of manufacturing an electronic device according to the third embodiment of the present invention sequentially performs the resin layer arranging step, the alignment step, the first pressing/curing step, the soldering step, and the second pressing/curing step as a step of bonding the first terminal 3 of the support 1 and the second terminal 4 of the adherend 2 using the solder 5 to electrically connect the support 1 and the adherend 2. That is, in the method of manufacturing an electronic device according to the third embodiment of the present invention, when the resin layer 6 is pressed and cured before soldering, the curing rate of the obtained cured product of the resin layer 6 is reduced. Therefore, when the curing rate of the resin layer 6 is less than a target value even though soldering is performed, or in order to further increase the curing rate of the cured product of the resin layer 6, a step of curing the resin layer 6 while pressing the support and the adherend with the pressurized fluid is additionally performed after the soldering step, thereby increasing the curing rate of the resin layer 6 to a target value under pressure.

In this way, it is possible to reliably prevent the occurrence of a void in the cured product of the resin layer 6.

The first pressing/curing step of the method of manufacturing an electronic device according to the third embodiment of the present invention heats the support 1, the adherend 2, and the resin layer 6 at a temperature equal to or more than the curing temperature of the resin layer 6 while pressing them with the pressurized fluid, thereby curing a portion of the resin layer 6. In this way, the resin layer 6 is cured.

In the method of manufacturing an electronic device according to the third embodiment of the present invention, the curing rate of the cured product of the resin layer 6 obtained in the first pressing/curing step is appropriately selected. The curing rate of the cured product of the resin layer 6 is preferably in the range of 1% to 90%, more preferably in the range of 5% to 60%, and most preferably in the range of 10% to 50%. In the first pressing/curing step, it is possible to adjust the curing rate of the cured product of the resin layer 6 obtained in the first pressing/curing step by appropriately selecting the heating temperature and heating time of the support 1, the adherend 2, and the resin layer 6. In the method of manufacturing an electronic device according to the third embodiment of the present invention, the curing rate of the cured product of the resin layer 6 obtained in the first pressing/curing step is calculated by the same method as that used to calculate the curing rate of the cured product of the resin layer 6 obtained in the pressing/curing step of the method of manufacturing an electronic device according to the second embodiment of the present invention.

In the first pressing/curing step, as described above, the heating temperature of the support 1, the adherend 2, and the resin layer 6 is appropriately selected depending on the curing rate of the cured product of the resin layer 6. The heating temperature may be equal to or more than the curing temperature of the resin layer 6. The heating temperature is generally in the range of 100° C. to 250° C. and preferably in the range of 150° C. to 200° C. The heating time is generally in the range of 0.5 minutes to 60 minutes and preferably in the range of 1 minute to 30 minutes.

The pressurized fluid used in the first pressing/curing step is the same as that used in the pressing/curing step according to the first embodiment.

In the first pressing/curing step, the pressing force of the pressurized fluid against the laminate including the support 1, the adherend 2, and the resin layer 6 is in the range of 0.1 MPa to 10 MPa and preferably in the range of 0.5 MPa to 5 MPa. In the first pressing/curing step, when the pressing force of the pressurized fluid against the laminate including the support 1, the adherend 2, and the resin layer 6 is equal to or more than 0.1 MPa, it is possible to destroy a void in the resin layer 6 with the pressing force so as to be buried in the resin layer 6 even when the void is formed in the resin layer 6. As a result, a void is less likely to occur in the cured product of the resin layer 6. In addition, it is possible to prevent the occurrence of a void in the resin layer 6.

On the other hand, when the pressing force of the pressurized fluid against the laminate including the support 1, the adherend 2, and the resin layer 6 is equal to or less than 10 MPa, it is possible to prevent an increase in the size of an apparatus for pressing the laminate, for example, the heating oven shown in FIG. 5 and prevent the structure of the apparatus from being complicated.

In the first pressing/curing step, a method of curing the resin layer 6 while pressing the laminate with the pressurized fluid is the same as the method of curing the resin layer 6 while pressing the laminate with the pressurized fluid in the pressing/curing step according to the first embodiment.

The soldering step of the method of manufacturing an electronic device according to the third embodiment of the present invention is the following step:

(3-I) The distance between the first terminal 3 and the second terminal 4 is reduced while the laminate including the support 1, the adherend 2, and the cured product of the resin layer 6 cured in the first pressing/curing step is heated at a temperature equal to or more than the temperature at which the first terminal 3 and the second terminal 4 can be soldered, without the second terminal 4 being brought into contact with the solder 5, thereby bonding the first terminal 3 and the second terminal 4 with the solder 5; or (3-II) The first terminal 3 and the second terminal 4 contact each other with the solder 5 interposed therebetween and the laminate including the support 1, the adherend 2, and the cured product of the resin layer 6 cured in the first pressing/curing step is heated at a temperature equal to or more than the temperature at which the first terminal 3 and the second terminal 4 can be soldered, thereby bonding the first terminal 3 and the second terminal 4 with the solder 5.

In (3-II), the support 1, the adherend 2, and the resin layer 6 may be pressed by, for example, a pressing plate with the first terminal 3 being brought into contact with the second terminal 4 such that the distance between the first terminal 3 and the second terminal 4 is further reduced.

In the soldering step, the temperature equal to or more than the temperature at which the first terminal 3 and the second terminal 4 can be soldered and combinations (a), (b) and (c) of the metal materials forming the solder 5 and the terminals are the same as those in the soldering step according to the first embodiment.

In the soldering step, the heating temperature of the support 1, the adherend 2, and the cured product of the resin layer 6 cured in the first pressing/curing step may be equal to or more than the temperature at which the first terminal 3 and the second terminal 4 can be soldered and is appropriately selected. The heating temperature is generally in the range of 110° C. to 250° C. and preferably in the range of 170° C. to 230° C. In the soldering step, the heating time of the support 1, the adherend 2, and the cured product of the resin layer 6 cured in the first pressing/curing step is appropriately selected depending on the kind of solder. The heating time is generally in the range of 1 second to 20 minutes and preferably in the range of 60 seconds to 15 minutes.

In the soldering step, when the combination of the metal materials forming the solder 5 and the terminals is (a) or (b), (3-I) the distance between the first terminal 3 and the second terminal 4 is reduced while the support 1, the adherend 2, and the cured product of the resin layer 6 cured in the first pressing/curing step are heated at a temperature equal to or more than the temperature at which the first terminal 3 and the second terminal 4 can be soldered, that is, a temperature equal to or more than the melting point of the solder 5. In this case, the distance between the support 1 and the adherend 2 is reduced and thus the distance between the first terminal 3 and the second terminal 4 is reduced. However, since the cured product of the resin layer 6 cured in the first pressing/curing step is provided between the support 1 and the adherend 2, the distance between the support 1 and adherend 2 is reduced while the cured product of the resin layer 6 obtained in the first pressing/curing step is compressed in the vertical direction. As a result, the distance between the first terminal 3 and the second terminal 4 is reduced. In this case, the compression pressure applied to the resin layer 6 is in the range of 0.01 MPa to 10 MPa and preferably in the range of 0.1 MPa to 1 MPa. The compression pressure applied to the resin layer 6 is the load of the resin layer 6, which is a compressed portion, per unit area.

In the soldering step, in a case in which the combination of the metal materials forming the solder 5 and the terminals is (c), when the first terminal 3 and the second terminal 4 contact each other with the solder 5 interposed therebetween in the alignment step, (3-II) the support 1, the adherend 2, and the cured product of the resin layer 6 cured in the first pressing/curing step are heated at a temperature equal to or more than the temperature at which the first terminal 3 and the second terminal 4 can be soldered and then the metal material forming the terminal on which the solder 5 is not provided is diffused into the solder 5 to form an alloy. Therefore, it is possible to perform connection using the solder 5, without reducing the distance between the first terminal 3 and the second terminal 4. For example, it is possible to perform soldering by heating the support, the adherend, and the resin layer with a reflow apparatus for the solder 5 that does not compress the cured product of the resin layer 6. In the soldering step, when the combination of the metal materials forming the solder 5 and the terminals is (c), (3-I) the distance between the first terminal 3 and the second terminal 4 is reduced while the support 1, the adherend 2, and the cured product of the resin layer 6 cured in the first pressing/curing step are heated at a temperature equal to or more than the melting point of the solder 5, thereby performing soldering. When the combination of the metal materials forming the solder 5 the terminals is (c), in the soldering step, soldering is performed by the method (3-II) to prevent the warping of the support 1. Therefore, a void is less likely to be formed in the cured product. When soldering is performed by the method (3-I), it is possible to reliably perform soldering. Therefore, when the combination of the metal materials forming the solder 5 and the terminals is (c), in the soldering step, it is possible to appropriately select a soldering method.

The second pressing/curing step of the method of manufacturing an electronic device according to the third embodiment of the present invention heats the support 1, the adherend 2, and the cured product of the resin layer 6 obtained in the first pressing/curing step at a temperature equal to or more than the curing temperature of the resin layer 6 while pressing them with the pressurized fluid, thereby further curing the resin layer 6 cured in the first pressing/curing step.

In the second pressing/curing step, the heating temperature of the support 1, the adherend 2, and the cured product of the resin layer 6 cured in the first pressing/curing step may be equal to or more than the curing temperature of the resin layer 6 and is appropriately selected. The heating temperature is generally in the range of 100° C. to 250° C. and preferably in the range of 150° C. to 200° C. In the second pressing/curing step, the heating time of the support 1, the adherend 2, and the cured product of the resin layer 6 cured in the first pressing/curing step is appropriately selected depending on the kind of resin layer 6. The heating time is generally in the range of 0.5 hour to 3 hours and preferably in the range of 1 hour to 2 hours.

The pressurized fluid used in the second pressing/curing step is the same as that used in the pressing/curing step according to the first embodiment.

In the second pressing/curing step, the pressing force of the pressurized fluid against the support 1, the adherend 2, and the cured product of the resin layer 6 obtained in the first pressing/curing step is in the range of 0.1 MPa to 10 MPa and preferably in the range of 0.5 MPa to 5 MPa. In the second pressing/curing step, when the pressing force of the pressurized fluid against the laminate including the support 1, the adherend 2, and the resin layer 6 is equal to or more than 0.1 MPa, it is possible to destroy a void in the resin layer 6 with the pressing force so as to be buried in the resin layer 6 even when the void is formed in the resin layer 6. As a result, a void is less likely to occur in the cured product of the resin layer 6. In addition, it is possible to prevent the occurrence of a void in the resin layer 6.

On the other hand, when the pressing force of the pressurized fluid against the laminate including the support 1, the adherend 2, and the resin layer 6 is equal to or less than 10 MPa, it is possible to prevent an increase in the size of an apparatus for pressing the laminate, for example, the heating oven shown in FIG. 5 and prevent the structure of the apparatus from being complicated.

In the second pressing/curing step, a method of curing the resin layer 6 obtained in the first pressing/curing step while pressing the laminate with the pressurized fluid is the same as the method of curing the resin layer 6 while pressing the laminate with the pressurized fluid in the pressing/curing step according to the first embodiment.

The curing rate of the cured product of the resin layer 6 obtained in the second pressing/curing step is preferably equal to or more than 80% and more preferably in the range of 90% to 100%. In the method of manufacturing an electronic device according to the third embodiment of the present invention, the curing rate of the cured product of the resin layer 6 obtained in the second pressing/curing step is calculated as follows.

(i) The resin layer 6 (that is, the resin layer 6 arranged between the first terminal 3 and the second terminal 4 in the resin layer arranging step) that has not been subjected to a heating process is heated by a differential scanning calorimeter (DSC) under the measurement conditions of a measurement temperature range of 25° C. to 300° C. and a rate of temperature increase of 10° C./minute, and the amount A4 of heat generated at that time is measured. (ii) The resin layer 6 having the same heat history (the heating temperature and the heating time) as that in the first pressing/curing step, the soldering step, and the second pressing/curing step is prepared and is heated by the same measurement method, and the amount B4 of heat generated at that time is measured. (iii) A curing rate C4 (%) is calculated by the following Expression 5:

$$C4(\%) = \{(A4 - B4)/A4\} \times 100 \quad (5)$$

Fourth Embodiment

A method of manufacturing an electronic device according to a fourth embodiment of the present invention bonds a first terminal 3 of a support 1 and a second terminal 4 of an adherend 2 using solder 5 to electrically connect the support 1 and the adherend 2. The method of manufacturing an electronic device sequentially performs a resin layer arranging step of arranging a resin layer 6 having a flux action between the first terminal 3 and the second terminal 4 to be bonded to each other, an alignment step of aligning the first terminal 3 and the second terminal 4 to be bonded to each other, and a soldering and pressing/curing step of soldering the first terminal 3 and the second terminal 4 and curing the resin layer 6 at the same time while pressing a laminate including the support 1, the adherend 2, and the resin layer 6 with a pressurized fluid.

In the method of manufacturing an electronic device according to the fourth embodiment of the present invention, the support 1, the first terminal 3, the adherend 2, the second terminal 4, the solder 5, the resin layer 6 having a flux action, the resin layer arranging step, and the alignment step are the same as the support 1, the first terminal 3, the adherend 2, the second terminal 4, the solder 5, the resin layer 6 having a flux action, the resin layer arranging step, and the alignment step in the method of manufacturing an electronic device according to the first embodiment of the present invention, and a description thereof will not be repeated. The soldering and pressing/curing step of the method of manufacturing an electronic device according to the fourth embodiment of the present invention will be described below.

The method of manufacturing an electronic device according to the fourth embodiment of the present invention sequentially performs the resin layer arranging step, the alignment step, the pressing/curing step, and the soldering and pressing/curing step as a step of bonding the first terminal 3 of the support 1 and the second terminal 4 of the adherend 2 using the solder 5 to electrically connect the support 1 and the adherend 2.

The soldering and pressing/curing step of the method of manufacturing an electronic device according to the fourth embodiment of the present invention is the following step:

(4-III) The support 1, the adherend 2, and the resin layer 6 is heated at a temperature equal to or more than the curing temperature of the resin layer 6 while a laminate including the support 1, the adherend 2, and the resin layer 6 is pressed by the pressurized fluid, without the second terminal 4 being brought into contact with the solder 5, thereby curing the resin layer 6. During the curing process, the support 1, the adherend 2, and the resin layer 6 are heated at a temperature equal to or more than the temperature at which the first terminal 3 and the second terminal 4 can be soldered in a pressurized atmosphere for curing the resin layer 6 while the laminate is compressed. The distance between the first terminal 3 and the second terminal 4 is reduced by the compression and the soldering of the first terminal 3 and the second terminal 4 and the pressing/curing of the resin layer 6 are performed at the same time; or (4-IV) The first terminal 3 and the second terminal 4 contact each other with the solder 5 interposed therebetween and the laminate including the support 1, the adherend 2, and the cured product of the resin layer 6 cured in the first pressing/curing step is heated at a temperature equal to or more than the temperature at which the first terminal 3 and the second terminal 4 can be soldered, thereby performing the soldering of the first terminal 3 and the second terminal 4 and the pressing/curing of the resin layer 6 at the same time.

In (4-IV), the support 1, the adherend 2, and the resin layer 6 may be pressed by, for example, a pressing plate with the first terminal 3 being brought into contact with the second terminal 4 such that the distance between the first terminal 3 and the second terminal 4 is further reduced.

In the soldering and pressing/curing step, the temperature equal to or more than the temperature at which the first terminal 3 and the second terminal 4 can be soldered and combinations (a), (b) and (c) of the metal materials forming the solder 5 and the terminals are the same as those in the soldering step according to the first embodiment.

The pressurized fluid used in the soldering and pressing/curing step is the same as that used in the pressing/curing step according to the first embodiment. In the soldering and pressing/curing step, a method of soldering and curing the resin layer 6 while pressing the laminate with the pressurized fluid is the same as the method of curing the resin layer 6 while pressing the laminate with the pressurized fluid in the pressing/curing step according to the first embodiment.

In the soldering and pressing/curing step, the pressing force of the pressurized fluid against the laminate including the support 1, the adherend 2, and the resin layer 6 is in the range of 0.1 MPa to 10 MPa and preferably in the range of 0.5 MPa to 5 MPa. In the soldering and pressing/curing step, when the pressing force of the pressurized fluid against the support 1, the adherend 2, and the resin layer 6 is equal to or more than 0.1 MPa, it is possible to destroy a void in the resin layer 6 with the pressing force so as to be buried in the resin layer 6 even when the void is formed in the resin layer 6. As a result, a void is less likely to occur in the cured product of the resin layer 6. In addition, it is possible to prevent the occurrence of a void in the resin layer 6.

On the other hand, in the soldering and pressing/curing step, when the pressing force of the pressurized fluid against the support 1, the adherend 2, and the resin layer 6 is equal to or less than 10 MPa, it is possible to prevent an increase in the size of an apparatus for pressing the laminate, for example, the heating oven shown in FIG. 5 and prevent the structure of the apparatus from being complicated.

In the soldering and pressing/curing step, when the combination of the metal materials forming the solder 5 and the terminals is (a) or (b), (4-III) the support 1, the adherend 2, and the resin layer 6 are heated at a temperature equal to or more than the curing temperature of the resin layer 6 while the resin layer 6 is cured. During the curing process, the support 1, the adherend 2, and the resin layer 6 are compressed while being heated at a temperature equal to or more than the temperature at which the first terminal 3 and the second terminal 4 can be soldered in a pressurized atmosphere for curing the resin layer 6, that is, a temperature equal to or more than the melting point of the solder 5. In this way, the distance between the first terminal 3 and the second terminal 4 is reduced. In this case, when the support 1, the adherend 2, and the resin layer 6 are heated at a temperature equal to or more than the curing temperature of the resin layer 6 while being pressed by the pressurized fluid and the resin layer 6 is cured, the heating temperature may be equal to or more than the curing temperature of the resin layer 6. The heating temperature is generally in the range of 100° C. to 250° C. and preferably in the range of 150° C. to 200° C. In addition, the heating time is appropriately selected depending on the kind of resin layer 6. The heating time is generally in the range of 3 seconds to 120 minutes and preferably in the range of 10 seconds to 90 minutes. During the curing process, the support 1, the adherend 2, and the resin layer 6 are compressed while being heated at a temperature equal to or more than the melting point of the solder 5 in a pressurized atmosphere for curing the resin layer 6, and the distance between the support 1 and the adherend 2 is reduced. As a result, the distance between the first terminal 3 and the second terminal 4 is reduced. However, since the resin layer 6 is provided between the support 1 and the adherend 2, the distance between the support 1 and adherend 2 is reduced while the resin layer 6 is compressed in the vertical direction. In this way, the distance between the first terminal 3 and the second terminal 4 is reduced. In this case, the compression pressure applied to the resin layer 6 is in the range of 0.01 MPa to 10 MPa and preferably in the range of 0.1 MPa to 1 MPa. The compression pressure applied to the resin layer 6 is the load of the resin layer 6, which is a compressed portion, per unit area.

In the soldering and pressing/curing step, in a case in which the combination of the metal materials forming the solder and the terminals is (c), when the first terminal 3 and the second terminal 4 contact each other with the solder 5 interposed therebetween in the alignment step, (4-IV) the support 1, the adherend 2, and the resin layer 6 are heated at a temperature equal to or more than the temperature at which the resin layer 6 can be cured and the first terminal 3 and the second terminal 4 can be soldered while being pressed by the pressurized fluid, and then the metal material forming the terminal on which the solder 5 is not provided is diffused into the solder 5 to form an alloy. Therefore, it is possible to perform connection using the solder 5 and press and cure the resin layer 6, without reducing the distance between the first terminal 3 and the second terminal 4. In this case, when the support 1, the adherend 2, and the resin layer 6 are heated at a temperature equal to or more than the temperature at which the resin layer 6 can be cured and the first terminal 3 and the second terminal 4 can be soldered while being pressed by the pressurized fluid, the heating temperature may be equal to or more than the curing temperature of the resin layer 6 and the temperature at which the first terminal 3 and the second terminal 4 can be soldered. The heating temperature is generally in the range of 100° C. to 250° C. and preferably in the range of 170° C. to 230° C. In addition, the heating time is appropriately selected by the kind of resin layer 6. The heating time is generally in the range of 3 seconds to 120 minutes and preferably in the range of 10 seconds to 90 minutes. For example, the support 1, adherend 2, and the resin layer 6 are placed in the heating oven such that the first terminal 3 and the second terminal 4 are aligned and brought into contact with each other. Then, the support 1, adherend 2, and the resin layer 6 in the heating oven are heated at a temperature equal to or more than the temperature at which the resin layer 6 can be cured and the first terminal 3 and the second terminal 4 can be soldered while being pressed by the pressurized fluid. In this way, it is possible to perform soldering and press/cure the resin layer 6. After alignment, the second terminal 4 may be stuck into the resin layer 6 while the support 1, the adherend 2, and the resin layer 6 are heated, before the laminate is put into the heating oven. It is preferable to adjust the distance between the support 1 and the adherend 2 such that the second terminal 4 contacts the solder 5. Since the leading end of the second terminal 4 contacts the solder 5, it is possible to reliably perform soldering in the soldering and resin pressing/curing step even when the melt viscosity of the resin layer is high. When the second terminal 4 is stuck into the resin layer 6 after alignment, the second terminal 4 may be stuck into the resin layer 6 while the support 1, the adherend 2, and the resin layer 6 are heated. The heating temperature is not particularly limited, and is preferably in the range of 40° C. to 250° C. and more preferably in the range of 60° C. to 180° C. When the heating temperature is in the above-mentioned range, it is possible to ensure the fluidity of the resin layer in the soldering and resin pressing/curing step, which will be described below. Therefore, it is possible to effectively remove an oxide film on the surface of the solder.

When the second terminal 4 is stuck into the resin layer 6 after alignment, the second terminal 4 may be stuck into the resin layer 6 while the support 1, the adherend 2, and the resin layer 6 are compressed. The compression pressure is not particularly limited and is preferably in the range of 0.001 MPa to 10 MPa and more preferably in the range of 0.01 MPa to 1 MPa. When the compression pressure is in the above-mentioned range, it is possible to ensure the contact area between the solder 5 on the first terminal 3 and the second terminal 4. Therefore, it is possible to reliably perform soldering in the soldering and resin pressing/curing step, which will be described below.

In addition, the above-mentioned heating and compression may be performed at the same time. When the heating and compression are performed at the same time, it is easy to stick the second terminal 4 into the resin layer 6 and it is possible to easily bring into contact the solder 5 on the first terminal 3 with the second terminal 4.

In the soldering and pressing/curing step, when the combination of the metal materials forming the solder 5 and the terminals is (c), (4-III) the support 1, the adherend 2, and the resin layer 6 are heated at a temperature equal to or more than the curing temperature of the resin layer 6 while being pressed by the pressurized fluid, and the resin layer 6 is cured. During the curing process, the support 1, the adherend 2, and the resin layer 6 are compressed while being heated at a temperature equal to or more than the melting point of the solder 5 in a pressurized atmosphere for curing the resin layer 6 and the distance between the first terminal 3 and the second terminal 4 is reduced. In this way, it is possible to perform soldering and the pressing and curing of a resin. When the combination of the metal materials forming the solder 5 and the terminals is (c), soldering is performed by the method (4-IV) in the soldering and pressing/curing step, and the warping of the support 1 is less likely to occur. Therefore, a void is less likely to occur in the cured product. In addition, when soldering is performed by the method (4-III), it is possible to reliably perform soldering. Therefore, when the combination of the metal materials forming the solder 5 and the terminals is (c), it is possible to appropriately select the method (III) or (IV) in the soldering and pressing/curing step.

As a method of performing soldering while performing pressing with the pressurized fluid and curing the resin layer 6 at the same time in the soldering and pressing/curing step, for example, in FIG. 7, the following method is exemplified: a method of introducing a pressurized fluid 10 and applying a load to the adherend 2 from the upper side using a press provided in the heating oven 8 during a process of heating the support 1, the adherend 2, and the resin layer 6 in the heating oven 8 while performing pressing in the heating oven 8. Specifically, a press is provided in the heating oven 8, and the support 1, the adherend 2, and the resin layer 6 are attached to the press. Then, the pressurized fluid 10 is introduced to increase the internal pressure of the heating oven 8. Then, the support 1, the adherend 2, and the resin layer 6 are heated in the heating oven 8 at a temperature equal to or more than the curing temperature of the resin layer 6, for example, 180° C., for 60 minutes while being pressed by the pressurized fluid 10, thereby curing the resin layer 6. During the curing process, for example, after 10 minutes of heating at 180° C. in the pressurized atmosphere, the press that has a press surface heated at a temperature equal to or more than the melting point of the solder 5, for example, 230° C. and is provided in the heating oven 8 applies a load to the adherend 2 from the upper side for, for example, 15 seconds at 180° C. in the pressurized atmosphere, thereby performing connection with the solder 5. That is, in the soldering and pressing/curing step, during the curing of the resin layer 6, soldering and the curing of the resin layer 6 are performed at the same time while pressing the laminate with the pressurized fluid in a heated and pressurized atmosphere.

The following (d) to (f) are given as an example.

(d) The temperature of the solder 5 and the second terminal 4 increases to a value at which the solder 5 and the second terminal 4 can be soldered while the laminate is pressed by the pressurized fluid, and the temperature is maintained for a predetermined period of time, for example, 5 minutes to 180 minutes. In this way, the bonding of the solder 5 and the second terminal 4, the curing of the resin layer 6, and the removal of a void are performed.

(e) The temperature of the solder 5 and the second terminal 4 increases to a value at which the solder 5 and the second terminal 4 can be soldered while the laminate is pressed by the pressurized fluid, and the temperature is maintained for a predetermined period of time, for example, 3 seconds to 10 minutes, thereby bonding the solder 5 and the second terminal 4. Then, the temperature decreases to a value at which the resin layer 6 is cured while the laminate is pressed by the pressurized fluid, and the temperature is maintained for a predetermined period of time, for example, 5 minutes to 180 minutes. In this way, the curing of the resin layer 6 and the removal of a void are performed.

(f) The temperature increases to a value at which the resin layer 6 is cured while the laminate is pressed by the pressurized fluid, and the temperature is maintained for a predetermined period of time, for example, 5 minutes to 180 minutes, thereby curing the resin layer 6 and removing a void. Then, the temperature of the solder 5 and the second terminal 4 increases to a value at which the solder 5 and the second terminal 4 can be soldered while the laminate is pressed by the pressurized fluid, and the temperature is maintained for a predetermined period of time, for example, 3 seconds to 10 minutes, thereby bonding the solder 5 and the second terminal 4.

In (e) and (f), the bonding between the solder 5 and the second terminal 4, the curing of the resin layer 6 and the removal of a void are individually performed. However, the bonding between the solder 5 and the second terminal 4, the curing of the resin layer 6 and the removal of a void may be performed at the same time.

The same pressurized fluid as that in each of the above-described embodiments may be used. The pressurized fluid is preferably gas, such as nitrogen gas, argon gas, or air. In particular, non-oxidizing gas that is inexpensive and prevents the oxidation of the support 1 and the adherend 2, such as nitrogen gas, is preferable.

The curing rate of the cured product of the resin layer 6 obtained in the soldering and pressing/curing step is preferably equal to or more than 80% and more preferably in the range of 90% to 100%. In the method of manufacturing an electronic device according to the fourth embodiment of the present invention, the curing rate of the cured product of the resin layer 6 obtained in the soldering and pressing/curing step is calculated as follows.

(i) The resin layer 6 (that is, the resin layer 6 arranged between the first terminal 3 and the second terminal 4 in the resin layer arranging step) that has not been subjected to a heating process is heated by a differential scanning calorimeter (DSC) under the measurement conditions of a measurement temperature range of 25° C. to 300° C. and a rate of temperature increase of 10° C./minute, and the amount A5 of heat generated at that time is measured. (ii) The resin layer 6 having the same heat history (the heating temperature and the heating time) as that in the soldering and pressing/curing step is prepared and is heated by the same measurement method, and the amount B5 of heat generated at that time is measured. (iii) A curing rate C5 (%) is calculated by the following Expression 6:

$$C5(\%) = \{(A5-B5)/A5\} \times 100 \quad (6)$$

In the method of manufacturing an electronic device according to the first embodiment of the present invention, in the pressing/curing step, the resin layer 6 is cured while the laminate is pressed by the pressurized fluid such that a void in the resin layer 6 is crushed, and the curing of the resin progresses. Therefore, a void is less likely to occur in the cured product. It is possible to prevent the occurrence of a void in the cured product. Therefore, when an electronic device is heated at a temperature equal to or more than the melting point of solder, a short circuit between adjacent terminals or swelling starting from a void is prevented.

In addition, it is possible to prevent the occurrence of a crack starting from a void in the resin layer 6.

In the pressing/curing step, pressure is uniformly applied to the laminate including the support 1, the adherend 2, and the resin layer 6 in all directions by the pressurized fluid. Therefore, it is possible to prevent a molten material of the resin layer 6 from bleeding from the gap between the support 1 and the adherend 2 to the periphery.

In the first embodiment, before the resin layer 6 is cured, the first terminal 3 and the second terminal 4 are soldered. Therefore, the spreading of the solder 5 to the second terminal 4 is not prevented by the cured resin layer 6.

In the methods of manufacturing an electronic device according to the second, third, and fourth embodiments of the present invention, the resin layer 6 is cured while the laminate is pressed by the pressurized fluid. A void in the resin layer 6 is crushed and the curing of the resin progresses. Therefore, a void is less likely to occur in the cured product. In addition, pressure is uniformly applied to the support 1, the adherend 2, and the resin layer 6 in all directions by the pressurized fluid. Therefore, it is possible to prevent a molten material of the resin layer 6 from bleeding from the gap between the support 1 and the adherend 2 to the periphery.

In the second embodiment, after the first terminal 3 and the second terminal 4 are aligned with each other, the resin layer 6 is cured and the first terminal 3 and the second terminal 4 are soldered. Therefore, it is possible to reliably prevent the positional deviation between the first terminal 3 and the second terminal 4.

As in the second embodiment, before soldering, the resin layer 6 is cured. Therefore, it is possible to prevent the occurrence of a void due to foaming in the resin layer 6 when soldering is performed.

In the third embodiment, after the resin layer 6 is cured a little while being pressed, soldering is performed and the resin layer 6 is cured again while being pressed. Therefore, it is possible to prevent the occurrence of a void while ensuring the spreading of the solder 5 to the second terminal 4.

As in the fourth embodiment, pressing is also performed when the first terminal 3 and the second terminal 4 are bonded to each other while the resin layer 6 is pressed and heated. Therefore, it is possible to prevent the occurrence of a void while ensuring the spreading of the solder 5 to the second terminal 4.

As in the fourth embodiment, the curing of the resin layer 6 and the bonding of the first terminal 3 and the second terminal 4 are performed at the same time. Therefore, it is possible to reduce the manufacturing time.

In the fourth embodiment, when the first terminal 3 and the second terminal 4 are bonded to each other, the laminate is pressed. The pressing makes it possible to increase the density of the resin layer 6 and reduce the volume of the resin layer 6. Therefore, it is possible to apply force in a direction in which the first terminal 3 and the second terminal 4 are compressed. When the first terminal 3 and the second terminal 4 are bonded to each other, the laminate is pressed by a fluid. Therefore, it is possible to prevent the flowing of a resin due to the foaming of the resin layer 6 and thus reduce the positional deviation between the first terminal 3 and the second terminal 4.

In the first to fourth embodiments, when the resin layer 6 is cured, the laminate 4 is pressed by a fluid. When the laminate is pressed by, for example, a press plate, it is difficult to prevent the occurrence of a void in the resin layer 6. However, when the laminate is pressed by a fluid, pressure is applied to the resin layer 6 in the vertical and horizontal directions thereof, which makes it possible to prevent the occurrence of a void.

(Resin Layer 6)

Next, a resin composition forming the resin layer 6 having a flux action which is used in the methods of manufacturing an electronic device according to the first to fourth embodiments of the present invention will be described. Each component may be one kind of compound or a combination of a plurality of compounds.

The resin composition forming the resin layer 6 having a flux action (hereinafter, also referred to as a resin composition according to the present invention) includes a compound having a flux action and a thermosetting resin. The resin composition according to the present invention may include as a compound having a flux action a flux activating curing agent which acts as a curing agent of a thermosetting resin.

The resin composition according to the present invention may be either a solid resin composition or a liquid resin composition.

The thermosetting resin contained in the resin composition according to the present invention is not particularly limited, but examples thereof include an epoxy resin, an oxetane resin, a phenol resin, a (meth)acrylate resin, an unsaturated polyester resin, a diallyl phthalate resin, and a maleimide resin. Among others, an epoxy resin is preferable. The epoxy resin is suitably used since it is excellent in curability, preservability, and heat resistance, moisture resistance, chemical resistance, or the like in a cured product.

The epoxy resin contained in the resin composition according to the present invention may be either an epoxy resin which is a solid at room temperature or an epoxy resin which is a liquid at room temperature, or both of them. By incorporating the epoxy resin in the resin composition according to the present invention, flexibility in the design of melting behavior of the resin layer 6 can be further improved.

The epoxy resin which is a solid at room temperature among the epoxy resins contained in the resin composition according to the present invention is not particularly limited, but examples thereof include a bisphenol A type epoxy resin, a bisphenol S type epoxy resin, a phenol novolac type epoxy resin, a cresol novolac type epoxy resin, a glycidylamine type epoxy resin, a glycidyl ester type epoxy resin, a trifunctional epoxy resin, and a tetrafunctional epoxy resin, and more specifically, ones containing both a solid trifunctional epoxy resin and a cresol novolac type epoxy resin. These may be singular or in combination of two or more kinds thereof.

The epoxy resin which is a liquid at room temperature among the epoxy resins contained in the resin composition according to the present invention is not particularly limited, but examples thereof include a bisphenol A type epoxy resin and a bisphenol F type epoxy resin, and these may be singular or in combination of two or more kinds thereof. The epoxy equivalent of the epoxy resin which is a liquid at room temperature is preferably 150 to 300, more preferably 160 to 250, and even more preferably 170 to 220. These ranges prevent increase in the shrinkage rate in the cured product of the resin layer 6, and thus the semiconductor device is reliably prevented from being in the warping state, and the reactivity with the polyimide resin is reliably prevented from being reduced.

The blending amount of this thermosetting resin in the resin composition according to the present invention is preferably 25 to 75% by weight, and more preferably 45 to 70% by weight, based on the constituent materials of the resin composition. The blending amount of the thermosetting resin in the resin composition within the above range can provide good curability during curing of the thermosetting resin, and allow for designing favorable melting behavior of the resin layer 6.

Further, a curing agent is preferably contained, in addition, the compound having a flux action, in the resin composition according to the present invention. This can further improve the curability of the thermosetting resin.

The curing agent contained in the resin composition according to the present invention is not particularly limited, but examples thereof include phenols, amines, and thiols. When an epoxy resin is contained as a thermosetting resin in the resin composition of the present invention, the curing agent is preferably a phenol. When the resin composition according to the present invention contains the epoxy resin as a thermosetting resin, by using a phenol as a curing agent, a good reactivity with the epoxy resin can be obtained for the resin layer 6, and further, low-dimensional change during curing and appropriate physical properties (for example, heat resistance and moisture resistance) after curing of the epoxy resin contained in the resin layer 6 can be obtained.

When the resin composition according to the present invention contains an epoxy resin as a thermosetting resin, the phenols contained as a curing agent are not particularly limited, but those having two or more functional groups which are capable of reacting with the epoxy resin, and which can promote improvement of the characteristics (for example, heat resistance and moisture resistance) of the cured product of the epoxy resin in the resin layer 6 are preferred.

Specific examples of the phenols having two or more functional groups which are capable of reacting with the epoxy resin include bisphenol A, tetramethyl bisphenol A, diallyl bisphenol A, biphenol, bisphenol F, diallyl bisphenol F, trisphenol, tetrakisphenol, phenol novolacs, and cresol novolacs, among which phenol novolacs and cresol novolacs are preferred. These can provide a remarkably appropriate melt viscosity of the resin layer 6 and improve the reactivity with the epoxy resin, and in addition, provide superior characteristics (for example, heat resistance and moisture resistance) of the cured product of the epoxy resin in the resin layer 6.

When using a phenol novolac as a curing agent contained in the resin composition according to the present invention, the blending amount of the curing agent in the resin composition according to the present invention is preferably 5 to 30% by weight, and more preferably 10 to 25% by weight, based on the constituent materials of the resin composition. By adjusting the blending amount of the curing agent in the resin composition to be within the above range, the thermosetting resin can be reliably cured for the resin layer 6, and the thermosetting resin and the unreacted curing agent are prevented from remaining in the resin layer 6. Thus, occurrence of migration due to existence of these residues can be preferably prevented.

In addition, when the thermosetting resin contained in the resin composition according to the present invention is an epoxy resin, the blending amount of the phenol novolac resin may be defined as an equivalent based on the epoxy resin. Specifically, the equivalent of the phenol novolacs based on the epoxy resin is preferably 0.5 to 1.2, more preferably 0.6 to 1.1, and most preferably 0.7 to 0.98. By adjusting the blending amount of the phenol novolac resin based on the epoxy resin to be within the above range, the thermosetting resin can be reliably cured for the resin layer 6, and the thermosetting resin and the unreacted curing agent are prevented from remaining in the resin layer 6, and thus, occurrence of migration due to existence of the residues can be appropriately prevented.

The resin composition according to the present invention may further contain, for example, an imidazole compound having a melting point of 150° C. or higher as a curing accelerator, in addition to the curing agent as described above. By this, curing of the resin layer 6 can be reliably carried out, and thus, the reliability of the semiconductor device can be increased. Examples of the imidazole compound having a melting point of 150° C. or higher include 2-phenyl hydroxyimidazole and 2-phenyl-4-methyl hydroxyimidazole. In addition, the upper limit of the melting point of the imidazole compound is not particularly limited, but is appropriately set, for example, in correspondence with the heating temperature during curing of the resin layer 6.

When the resin composition according to the present invention contains such an imidazole compound as a curing accelerator, the blending amount of the curing agent in the resin composition is preferably 0.005 to 10% by weight, and more preferably 0.01 to 5% by weight, based on the constituent materials of the resin composition. By adjusting the blending amount of the curing agent in the resin composition to be within the above range, it can more effectively function as a curing accelerator for the thermosetting resin to improve the curability of the thermosetting resin for the resin layer 6, and the melting viscosity of the resin layer 6 is not so high at a melting temperature of the solder 5 in the resin layer 6, thereby making it possible to obtain a favorable solder junction structure.

Moreover, the curing accelerators as described above may be singular or in combination of two or more kinds thereof.

Further, the resin composition according to the present invention may appropriately contain a coupling agent, a flux activator for increasing the activity of the compound having a flux action, and various additives for improving various characteristics such as compatibility, stability, and operability of the resin, in addition to the compound having a flux action and the thermosetting resin.

By incorporating a coupling agent in the resin composition according to the present invention, adhesiveness of the resin layer 6 to a support 1 and an adherend 2 can be further increased.

Examples of the coupling agent include silane coupling agents such as an epoxysilane coupling agent and an aromatic-containing aminosilane coupling agent. These may be singular or in combination of two or more kinds thereof.

The blending amount of the silane coupling agent in the resin composition according to the present invention is preferably 0.01 to 5% by weight based on the constituent materials of the resin composition.

When the resin composition according to the present invention is liquid, the resin composition according to the present invention can be applied onto the support 1 or the adherend 2. Further, when the resin composition according to the present invention is solid, the resin composition according to the present invention is dissolved or dispersed in a solvent to give a resin varnish, and the resin varnish can be applied onto the support 1 or the adherend 2.

When the resin composition according to the present invention is used as a resin varnish, the solvent is not particularly limited, but the solvents which are inert to the above-described constituent materials of the resin composition are preferable. Examples of the solvents include ketones such as acetone, methyl ethyl ketone, methyl isobutyl ketone, diisobutyl ketone (DIBK), cyclohexanone, and diacetone alcohol (DAA), aromatic hydrocarbons such as benzene, xylene and toluene, alcohols such as methyl alcohol, ethyl alcohol, isopropyl alcohol, and n-butyl alcohol, cellosolve-based substances such as methyl cellosolve, ethyl cellosolve, butyl cellosolve, methyl cellosolve acetate, ethyl cellosolve acetate, and butyrocellosolve acetate (BCSA), N-methyl-2-pyrrolidone (NMP), tetrahydrofuran (THF), dimethylformamide (DMF), dibasic ester (DBE), ethyl 3-ethoxypropionate (EEP), and dimethyl carbonate (DMC). Further, the content of the solvent in the resin varnish is preferably within a range such that the solid content mixed in the solvent may be 10 to 60% by weight.

Further, the resin composition according to the present invention may be formed into a film-shaped resin layer 6 and the film-shaped resin layer 6 may be laminated on the support 1 or the adherend 2. In this way, the resin layer 6 is arranged. When the resin composition according to the present invention is formed in the form of a film, the resin composition according to the present invention preferably further contains a film-forming resin, in addition to the compound having a flux action and thermosetting resin. By incorporating the film-forming resin in the resin composition according to the present invention, the resin layer 6 can be reliably made in the form of a film.

Examples of the film-forming resin include a (meth)acrylic resin, a phenoxy resin, a polyester resin, a polyurethane resin, a polyimide resin, a siloxane-modified polyimide resin, a polybutadiene, a polypropylene, a styrene-butadiene-styrene copolymer, a styrene-ethylene-butylene-styrene copolymer, a polyacetal resin, a polyvinyl butyral resin, a polyvinyl acetal resin, a butyl rubber, a chloroprene rubber, a polyamide resin, an acrylonitrile-butadiene copolymer, an acrylonitrile-butadiene-acrylic acid copolymer, an acrylonitrile-butadiene-styrene copolymer, a polyvinyl acetate, and nylon among which a (meth)acrylic resin and a phenoxy resin are preferred. By employing the (meth)acrylic resin or the phenoxy resin, the film-forming property can be compatible with the adhesiveness to the support 1 and the adherend 2. The film-forming resins may be singular or in combination of two or more kinds thereof.

Moreover, the (meth)acrylic resin with respect to the film-forming resin means a polymer of a (meth)acrylic acid and a derivative thereof or a copolymer of a (meth)acrylic acid or a derivative thereof and another monomer. In this regard, when describing the (meth)acrylic acid or the like, it means an acrylic acid or a methacrylic acid.

Specific examples of the acrylic resin used as a film-forming resin include polyacrylic acids, polymethacrylic acids, polyacrylic acid esters such as polymethyl acrylate, polyethyl acrylate, polybutyl acrylate, and 2-ethylhexyl-polyacrylate, polymethacrylic acid esters such as polymethyl methacrylate, polyethyl methacrylate, and polybutyl methacrylate, a polyacrylonitrile, a polymethacrylonitrile, a polyacrylamide, a butyl acrylate-ethyl acrylate-acrylonitrile copolymer, an acrylonitrile-butadiene copolymer, an acrylonitrile-butadiene-acrylic acid copolymer, an acrylonitrile-butadiene-styrene copolymer, an acrylonitrile-styrene copolymer, a methyl methacrylate-styrene copolymer, a methyl methacrylate-acrylonitrile copolymer, a methyl methacrylate-α-methylstyrene copolymer, a butyl acrylate-ethyl acrylate-acrylonitrile-2-hydroxyethyl methacrylate-methacrylic acid copolymer, a butyl acrylate-ethyl acrylate-acrylonitrile-2-hydroxyethyl methacrylate-acrylic acid copolymer, a butyl acrylate-acrylonitrile-2-hydroxyethyl methacrylate copolymer, a butyl acrylate-acrylonitrile-acrylic acid copolymer, a butyl acrylate-ethyl acrylate-acrylonitrile copolymer, and an ethyl acrylate-acrylonitrile-N,N-dimethylacrylamide copolymer. Among them, a butyl acrylate-ethyl acrylate-acrylonitrile copolymer and an ethyl acrylate-acrylonitrile-N,N-dimethylacrylamide are most preferred.

In addition, when a (meth)acrylic resin in which a monomer having a functional group such as a nitrile group, an epoxy group, a hydroxyl group, and a carboxyl group is copolymerized is used as an acrylic resin used as a film-forming resin, the adhesiveness of the film-shaped resin layer 6 to the support 1 and the adherend 2 and the compatibility with the thermosetting resin or the like can be improved. With regard to the (meth)acrylic resin, the use amount of the monomer having the functional group is not particularly limited, but is preferably 0.1 to 50 mol %, more preferably 0.5 to 45 mol %, and even more preferably 1 to 40 mol %, based on the total weight of the (meth)acrylic resin. By adjusting the amount within the above range, the adhesiveness of the support 1 and the adherend 2 can be excellent, while too strong stickiness of the film-shaped resin layer 6 can be properly prevented and improvement of the operability can be promoted.

The weight average molecular weight of the acrylic resin is not particularly limited, but is, for example, equal to or more than 1000 and equal to or less than 1000000, and preferably equal to or more than 3000 and equal to or less than 900000. When the weight average molecular weight of the acrylic resin is within the above range, the film-forming property of the resin composition can be further improved, while reliably attaining the flowability during curing.

Furthermore, when a phenoxy resin is used as the film-forming resin, a phenoxy resin having a number average molecular weight of 5000 to 15000 is preferred. By using the phenoxy resin of the number average molecular weight, the flowability of the film-shaped resin layer 6 can be suppressed and the thickness of the film-shaped resin layer 6 can be equalized.

The skeleton of the phenoxy resin is not particularly limited, but examples thereof include a bisphenol A type, a bisphenol F type, and a biphenyl skeleton type. Among them, a phenoxy resin having a saturated water absorption rate of 1% or less is preferred, which can suppress generation of foam, peel-off, or the like caused from the film-shaped resin layer 6.

Furthermore, with respect to the saturated water absorption rate, the phenoxy resin is processed to form a film having a thickness of 25 μm, the film is dried under the atmosphere of 100° C. for 1 hour (absolute dry), subsequently, the film is left in a constant-temperature zone with high humidity under the atmosphere of 40° C. and 90% RH, the change in the weight is measured every 24 hours, and using the weight at the time of saturation of change, the saturated water absorption rate can be calculated according to Expression 7 as described below:

Saturated water absorption rate(%)={(Weight at the time of saturation)−(Weight at the time of absolute dry)/(Weight at the time of absolute dry)}× 100     (7)

Further, when a polyimide resin is used as a film-forming resin, examples of the polyimide resin include those having an imide bond in the repeating unit. Examples of the polyimide resin include those obtained by reacting a diamine with an acid dianhydride and heating the obtained polyamide acid to cause dehydration and ring closure. Examples of the diamine include aromatic diamines such as 3,3'-dimethyl-4,4'-diaminodiphenyl, 4,6-dimethyl-m-phenylenediamine, and 2,5-dimethyl-p-phenylenediamine), siloxanediamines such as 1,3-bis(3-aminopropyl)-1,1,3,3-tetramethyldisiloxane, and these may be singular or in combination of two or more kinds thereof. Further, examples of the acid dianhydride include 3,3,4,4'-biphenyl tetracarboxylic acid, pyromellitic dianhydride, and 4,4'-oxydiphthalic dianhydride. In addition, the polyimide resin may be soluble or insoluble in the solvent as described below, but those which are soluble in the solvent are preferred. When the polyimide resin is soluble in the solvent, the phase solubility with the constituent materials contained in the solution materials is improved, and thus, the handleability is excellent. Particularly, a siloxane-modified polyimide resin is preferably used since it can be dissolved in various solvents.

Furthermore, the film-forming resin may be a commercially available product.

In addition, when the resin composition according to the present invention is formed into a film and used, it may contain various additives such as a plasticizer, a stabilizer, an inorganic filler, an antistatic agent, and a pigment, in a range in which the effects of the present invention are not affected adversely.

When the resin composition according to the present invention is formed into a film and used, the blending amount of the film-forming resin in the resin composition according to the present invention is preferably 5 to 45% by weight of the constituent materials of the resin composition. By adjusting the blending amount of the film-forming resin in the resin composition according to the present invention within the above range, reduction of the film-forming property of the film-shaped resin layer 6 can be suppressed while increase in the elastic modulus of the film-shaped resin layer 6 after curing can be suppressed. As a result, adhesiveness of the film-shaped resin layer 6 to the support 1 and the adherend 2 can be further improved. Furthermore, increase in the melting viscosity of the film-shaped resin layer 6 can be suppressed.

When the resin composition according to the present invention is formed into a film and used, it contains a thermosetting resin. The thermosetting resin is not particularly limited, but is preferably one containing an epoxy resin. The epoxy resin refers to any one of a monomer, an oligomer, and a polymer having an epoxy group. Specific examples of the epoxy resin include novolac type epoxy resins such as a phenol novolac type epoxy resin, and cresol novolac type epoxy resin; bisphenol type epoxy resins such as a bisphenol A type epoxy resin, and a bisphenol F type epoxy resin; a hydroquinone type epoxy resin; a biphenyl type epoxy resin; a stilbene type epoxy resin; a triphenol methane type epoxy resin; a triazine nuclear-containing epoxy resin; a dicyclopentadiene-modified phenol type epoxy resin; a naphthol type epoxy resin and aralkyl type epoxy resins, such as a phenol aralkyl type epoxy resin having a phenylene and/or biphenylene skeleton and a naphthol aralkyl type epoxy resin having a phenylene and/or biphenylene skeleton; and other trifunctional or higher epoxy resins.

When the resin composition according to the present invention is formed into a film and used, in which the resin composition according to the present invention contains an epoxy resin, the content of the epoxy resin contained in the resin composition according to the present invention is not particularly limited, but is preferably 10 to 90% by weight, and more preferably 20 to 80% by weight. By adjusting the content of the epoxy resin contained in the resin composition to be within the above range, the low coefficient of linear expansion of the film-shaped resin layer 6 after curing can be compatible with the toughness.

When the resin composition according to the present invention is formed into a film and used, in which the resin composition according to the present invention contains an epoxy resin, the softening point of the epoxy resin contained in the resin composition according to the present invention is not particularly limited as long as the epoxy resin has compatibility with the film-forming resin, but it is preferably 40 to 100° C., and more preferably 50 to 90° C. By adjusting the softening point to not lower than the lower limit, the tackiness of the film-shaped resin layer 6 can be reduced, and therefore, the operability of the film-shaped resin layer 6 can be improved. In addition, by adjusting the softening point to not higher than the upper limit, increase in the melting viscosity of the film-shaped resin layer 6 can be suppressed.

When the resin composition according to the present invention is formed into a film and used, in which the resin composition according to the present invention contains an epoxy resin, the resin composition according to the present invention is not particularly limited, but preferably contains a curing agent. The curing agent is appropriately selected from those which act as a curing agent for an epoxy resin. Specific examples thereof include amine-based curing agents including aliphatic polyamines such as diethylenetriamine, triethylenetetramine, and metaxylylenediamine, aromatic polyamines such as diaminodiphenylmethane, m-phenylenediamine, and diaminodiphenyl sulfone, and polyamine compounds such as dicyandiamide and organic acid dihydrazides, acid anhydride-based curing agents including aliphatic acid anhydrides such as hexahydrophthalic anhydride and methyltetrahydrophthalic anhydride, aromatic acid anhydrides such as trimellitic anhydride, pyromellitic anhydride, and benzophenonetetracarboxylic anhydride, and phenol-based curing agents such as a phenol novolac resin, a cresol novolac resin, a phenolaralkyl (containing a phenylene or biphenylene skeleton) resin, a naphtholaralkyl (containing a phenylene or biphenylene skeleton) resin, a triphenolmethane resin, a dicyclopentadiene type phenol resin, bis(mono- or di-t-butylphenol)propane, methylenebis(2-propenyl)phenol, propylenebis(2-propenyl)phenol, bis[(2-propenyloxy)phenyl]methane, bis[(2-propenyloxy)phenyl]propane, 4,4'-(1-methylethylidene)bis[2-(2-propenyl)phenol], 4,4'-(1-methylethylidene)bis[2-(1-phenylethyl)phenol], 4,4'-(1-methylethylidene)bis[2-methyl-6-hydroxymethylphenol], 4,4'-(1-methylethylidene)bis[2-methyl-6-(2-propenyl)phenol], and 4,4'-(1-methyltetradecylidene)bisphenol.

When the resin composition according to the present invention is formed into a film and used, in which the resin composition according to the present invention contains an epoxy resin, the content of the curing agent in the resin composition according to the present invention can be determined by calculating the equivalent ratio of the epoxy equivalents of the epoxy resin and the curing agent. When the curing agent is a phenol resin, the equivalent ratio of the epoxy equivalents of the epoxy resin and the functional group of the curing agent is preferably 0.5 to 1.5, and more preferably 0.7 to 1.3. By adjusting the equivalent ratio to be within the above range, heat resistance and preservability of the film can be compatible with each other.

When the resin composition according to the present invention is formed into a film and used, in which the resin composition according to the present invention contains an epoxy resin, the resin composition according to the present invention may contain a curing accelerator. Such a curing accelerator is appropriately selected from those which are capable of accelerating a curing reaction of an epoxy resin with a curing agent. Specific examples thereof include amine-based catalysts such as imidazoles, 1,8-diazabicyclo(5,4,0) undecene, and phosphorous compounds such as triphenylphosphine and a salt of tetra-substituted phosphonium with a polyfunctional phenol compound. Among these, imidazoles and phosphorous compounds are preferred, which have compatibility between rapid curability and preservability of the film-shaped resin layer 6, and corrosivity of a semiconductor element to an aluminum pad.

When the resin composition according to the present invention is formed into a film and used, in which the resin composition according to the present invention contains an epoxy resin, the content of the curing accelerator in the resin composition of the present invention is preferably 0.001 to 10% by weight, and more preferably 0.01 to 5% by weight. By adjusting the content to be within the above range, it is possible to maintain the balance among rapid curability and preservability of the film-shaped resin layer 6, and physical properties after curing.

As the imidazoles as a curing accelerator, imidazole compounds having a melting point of 150° C. or higher are preferred, and examples thereof include 2-phenyl hydroxyimidazole, 2-phenyl-4-methyl hydroxyimidazole, and 2-phenyl-4-methyl imidazole.

Among the phosphorous compounds as a curing accelerator, a salt of tetra-substituted phosphonium with a polyfunctional phenol compound is particularly preferred, which is excellent in rapid curability of the film-shaped resin layer 6, corrosivity of a semiconductor element to an aluminum pad, and preservability of the film-shaped resin layer 6.

The salt of a tetra-substituted phosphonium with a polyfunctional phenol compound is not a simple mixture, but a compound having a structure such as a salt structure or a supramolecular structure. The tetra-substituted phosphonium of the salt of a tetra-substituted phosphonium with a polyfunctional phenol compound is preferably the compound in which a phosphorous atom is four-coordinated by an alkyl group or an aromatic compound in the light of balance between curability and preservability of the film.

The substituents of the tetra-substituted phosphonium are not particularly limited and may be the same as or different from each other. A tetra-substituted phosphonium ion having a substituted or unsubstituted aryl or alkyl group is preferred since it is stable to heating or hydrolysis. Specific examples of the tetra-substituted phosphonium include tetraphenyl phosphonium, tetratolyl phosphonium, tetraethyl phenylphosphonium, tetramethoxyphenyl phosphonium, tetranaphthyl phosphonium, tetrabenzyl phosphonium, ethyltriphenyl phosphonium, n-butyltriphenyl phosphonium, 2-hydroxyethyltriphenyl phosphonium, trimethylphenyl phosphonium, methyldiethylphenyl phosphonium, methyldiarylphenyl phosphonium, and tetra-n-butyl phosphonium. Among these, tetraphenyl phosphonium is preferred in the light of the balance between rapid curability and preservability of the film.

The polyfunctional phenol compound in a molecular compound of a tetra-substituted phosphonium and a polyfunctional phenol compound refers to a phenol compound, in which at least one hydroxyl group of phenolic hydroxyl groups loses hydrogen to form a phenoxide type compound. Specific examples thereof include a hydroxybenzene compound, a biphenol compound, a bisphenol compound, a hydroxynaphthalene compound, a phenol novolac resin, and a phenol aralkyl resin.

Examples of the polyfunctional phenol compound include bisphenols such as bis(4-hydroxy-3,5-dimethylphenyl)methane (common name: tetramethylbisphenol-F), 4,4'-sulfonyldiphenol and 4,4'-isopropylidenediphenol (common name: bisphenol-A), bis(4-hydroxyphenyl)methane, bis(2-hydroxyphenyl)methane, and (2-hydroxyphenyl) (4-hydroxyphenyl)methane, as well as a mixture of three compounds among them, bis(4-hydroxyphenyl)methane, bis(2-hydroxyphenyl)methane, and (2-hydroxyphenyl)(4-hydroxyphenyl)methane (for example, bisphenol-F-D from Honshu Chemical Industry Co., Ltd.), dihydroxybenzenes such as 1,2-benzenediol, 1,3-benzenediol, and 1,4-benzenediol, trihydroxybenzenes such as 1,2,4-benzenetriol, various isomers of dihydroxynaphthalenes such as 1,6-dihydroxynaphthalene and their isomers, and various isomers of biphenols such as 2,2'-biphenol and 4,4'-biphenol, among which 1,2-dihydroxynaphthalene and 4,4'-sulfonyldiphenol are preferred, which are excellent in balance between rapid curability and preservability.

When the resin composition according to the present invention is formed into a film and used, the film-shaped resin layer 6 can be prepared by, for example, dissolving a compound having a flux action and a thermosetting resin, and if necessary, a film-forming resin or other components in a solvent to prepare materials (liquid materials) for forming the film-shaped resin layer 6, and then coating the materials for forming the film-shaped resin layer 6 on a substrate, which has been subjected to a peeling treatment, such as a polyester sheet, removing the solvent at a predetermined temperature, and then drying the residue.

Moreover, examples of the solvent which is used to prepare the materials for forming the film-shaped resin layer 6 include ketones such as acetone, methyl ethyl ketone, methyl isobutyl ketone, DIBK (diisobutyl ketone), cyclohexanone, and DAA (diacetone alcohol), aromatic hydrocarbons such as benzene, xylene, and toluene, alcohols such as methyl alcohol, ethyl alcohol, isopropyl alcohol, and n-butyl alcohol, cellosolve-based substances such as methyl cellosolve, ethyl cellosolve, butyl cellosolve, methyl cellosolve acetate, ethyl cellosolve acetate, and BCSA (butyl cellosolve acetate), NMP (N-methyl-2-pyrrolidone), THF (tetrahydrofuran), DMF (dimethylformamide), DBE (dibasic ester), EEP (ethyl 3-ethoxypropionate), and DMC (dimethyl carbonate).

Further, the thickness (average) of the film-shaped resin layer 6 is not particularly limited, but is preferably about 3 to 100 μm, and more preferably about 5 to 50 μm.

The present invention is based on the following.

[1] A method of manufacturing an electronic component that bonds a first terminal of a support and a second terminal of an adherend with solder to electrically connect the support and the adherend, comprising:

a resin layer arranging step of arranging a resin layer having a flux action between the first terminal and the second terminal to be bonded to each other;

an alignment step that aligns the first terminal and the second terminal to be bonded to each other;

a soldering step of soldering the first terminal and the second terminal;

a pressing/curing step of curing the resin layer while performing pressing with a pressurized fluid.

[2] A method of manufacturing an electronic component that bonds a first terminal of a support and a second terminal of an adherend with solder to electrically connect the support and the adherend, comprising:

a resin layer arranging step of arranging a resin layer having a flux action between the first terminal and the second terminal to be bonded to each other;

an alignment step that aligns the first terminal and the second terminal to be bonded to each other;

a pressing/curing step of curing the resin layer while performing pressing with a pressurized fluid; and a soldering step of soldering the first terminal and the second terminal.

[3] A method of manufacturing an electronic component that bonds a first terminal of a support and a second terminal of an adherend with solder to electrically connect the support and the adherend, comprising:

a resin layer arranging step of arranging a resin layer having a flux action between the first terminal and the second terminal to be bonded to each other;

an alignment step that aligns the first terminal and the second terminal to be bonded to each other;

a first pressing/curing step of curing the resin layer while performing pressing with a pressurized fluid;

a soldering step of soldering the first terminal and the second terminal; and a second pressing/curing step of curing the resin layer cured in the first pressing/curing step while performing pressing with the pressurized fluid.

[4] A method of manufacturing an electronic component that bonds a first terminal of a support and a second terminal of an adherend with solder to electrically connect the support and the adherend, comprising:

a resin layer arranging step of arranging a resin layer having a flux action between the first terminal and the second terminal to be bonded to each other;

an alignment step that aligns the first terminal and the second terminal to be bonded to each other; and a soldering and pressing/curing step of simultaneously performing the soldering of the first terminal and the second terminal and the curing of the resin layer while performing pressing with a pressurized fluid.

[5] The method of manufacturing an electronic component according to any one of [1] to [4], wherein the pressurized fluid is gas.

[6] The method of manufacturing an electronic component according to any one of [1] to [5], wherein the pressurized fluid is air.

[7] The method of manufacturing an electronic component according to any one of [1] to [4], wherein the pressing/curing step, the first pressing/curing step, the second pressing/curing step, or the soldering and pressing/curing step are performed by placing a processing object in a pressure vessel and heating the processing object while increasing the internal pressure of the pressure vessel with the pressurized fluid.

[8] The method of manufacturing an electronic component according to any one of [1] to [7], wherein, in the pressing/curing step, the first pressing/curing step, the second pressing/curing step, or the soldering and pressing/curing step, the pressing force of the pressurized fluid is in the range of 0.1 MPa to 10 MPa.

[9] The method of manufacturing an electronic component according to any one of [1] to [8], wherein the minimum melt viscosity of the resin layer arranged in the resin layer arranging step at a temperature of 100° C. to 200° C. is in the range of 1 Pa·s to 1000 Pa·s.

[10] The method of manufacturing an electronic component according to any one of [1] to [9], wherein the resin layer includes a thermosetting resin.

[11] The method of manufacturing an electronic component according to any one of [1] to [10], wherein the resin layer includes a resin (A) having at least one phenolic hydroxyl group and a resin (B) serving as a curing agent of the resin (A).

[12] An electronic component that is manufactured by the manufacturing method according to any one of [1] to [11].

EXAMPLES

Hereinafter, the present invention will be described in detail on the basis of examples and comparative examples. However, the present invention is not limited thereto.

(Support)

As a support, a circuit substrate (which served as a core material, was manufactured by Sumitomo Bakelite Co., Ltd., had part number ELC-4785GS, had a thermal expansion coefficient (Tg or less) of 11 ppm in the X-Y direction and a thermal expansion coefficient of 16 ppm in the Z direction) having a circuit pattern formed thereon was used, and a bump of the solder 5 (tin 96.5/silver 3.5) was formed on the first terminal in the circuit substrate.

(Adherend)

As an adherend, a semiconductor chip (size: a length of 15 mm, a width of 15 mm, and a thickness of 0.725 mm) in which the second terminal of the adherend had an Au bump was used.

Each of the number of first terminals of the support and the number of second terminals of the adherend was 100.

Example 1

Manufacture of Film-Shaped Resin Layer 45 parts by weight of cresol novolac-type epoxy resin EOCN-102070 (manufactured by Nippon Kayaku Co., Ltd.) as an epoxy resin, 10 parts by weight of PR-53467 (manufactured by Sumitomo Bakelite Co., Ltd.) as a phenol novolac resin, 20 parts by weight of SG-708-6 (manufactured by Nagase Chemtex Corporation) as acrylic rubber, 10 parts by weight of UC-3900 (manufactured by Toagosei Co., Ltd.) as acrylic polymer, 15 parts by weight of phenolphthalin (manufactured by Tokyo Chemical Industry Co., Ltd.) as a compound having a flux action, 0.5 parts by weight of KBM-303 (manufactured by Shin-Etsu Silicon Co., Ltd.) as a silane coupling agent, and 0.01 parts by weight of 2P4MZ (manufactured by Shikoku Chemicals Corporation) as an imidazole compound were dissolved in acetone to produce a varnish resin composition.

The obtained varnish resin composition was applied onto a polyester sheet (base) by a comma coater and was dried at 100° C. at which the acetone was volatilized for 3 minutes to obtain a film-shaped resin layer (a) with a thickness of 35 μm formed on the base.

(Manufacture of Electronic Device)

The film-shaped resin layer (a) formed on the base was laminated on the surface of the circuit substrate on which the bump of the solder 5 was formed by a roll laminator under the conditions of a temperature of 120° C. and a speed of 50 cm/minute. Then, the base peeled off (resin layer arranging step).

Then, the circuit substrate and the semiconductor chip were aligned such that the first terminal of the circuit substrate faced the second terminal of the semiconductor chip, and were heated and compressed by a flip chip bonder (DP-200 manufactured by Shibuya Kogyo Co., Ltd.) at 80° C. and 0.05 MPa for 7 seconds to obtain a laminate (alignment step).

Then, the laminate was heated and compressed by a flat press (MSA-2 manufactured by System Development Corporation) at 230° C. and 0.2 MPa for 5 seconds to bond the solder bump (first terminal) of the circuit substrate and the Au bump (second terminal) of the semiconductor chip (soldering step).

Then, the laminate was heated at 180° C. for 60 minutes in a commercial pressure-responsive oven while a pressing force of 0.5 MPa was applied to the inside of the oven using air (the laminate was pressed at 0.5 MPa) (pressing/curing step (1)) to manufacture an electronic device.

(Evaluation of Electronic Device)

The electronic device obtained in Example 1 was evaluated as follows. Evaluated items are shown together with content and the obtained result is shown in Table 1.

1. Measurement of Electrical Connection

The connection resistance of two adjacent soldering portions that were arbitrarily selected from the obtained electronic device was measured by a digital multimeter. Then, two adjacent soldering portions were arbitrarily selected from another nine points, and the connection resistance thereof was measured by the same method. That is, electrical connection was measured at a total of ten points. The meaning of each symbol is as follows:

O: Electrical connection was obtained at all of ten points; and

X: Electrical connection was not obtained at all of ten points.

2. Absence or presence of microvoids in cured product between support and adherend The obtained electronic device was cut and the cross section of the cured product was polished. Then, ten portions surrounded by the support, the adherend, and two adjacent soldering portions were arbitrarily selected, and a metallograph was used to observe whether there was a microvoid in each portion. The meaning of each symbol is as follows:

O: The microvoids were observed from all of ten portions; and

X: The microvoids were not observed from all of ten portions.

Example 2

Manufacture and Evaluation of Electronic Device

An electronic device was manufactured by the same method as that in Example 1 except that the heating and compression time in the soldering step was changed from 5 seconds to 15 seconds and then evaluated.

Example 3

Manufacture and Evaluation of Electronic Device

An electronic device was manufactured by the same method as that in Example 1 except that the heating and compression time in the soldering step was changed from 5 seconds to 115 seconds and then evaluated.

Example 4

Manufacture of Film-Shaped Resin Layer 45 parts by weight of bisphenol-A epoxy resin EPICLON-840S (manufactured by Dainippon Ink and Chemicals Inc.) as an epoxy resin, 15 parts by weight of PR-53467 (manufactured by Sumitomo Bakelite Co., Ltd.) as a phenol novolac resin, 25 parts by weight of YP-50 (manufactured by Tohto Kasei Co., Ltd.) as a phenoxy resin, 15 parts by weight of phenolphthalin (manufactured by Tokyo Chemical Industry Co., Ltd.) as a compound having a flux action, 0.5 parts by weight of KBM-303 (manufactured by Shin-Etsu Silicon Co., Ltd.) as a silane coupling agent, and 0.01 parts by weight of 2P4MZ (manufactured by Shikoku Chemicals Corporation) as an imidazole compound were dissolved in acetone to produce a varnish resin composition.

The obtained varnish resin composition was applied onto a polyester sheet (base) by a comma coater and was dried at 100° C. at which the acetone was volatilized for 3 minutes to obtain a film-shaped resin layer (b) with a thickness of 35 μm formed on the base.

(Manufacture and Evaluation of Electronic Device)

An electronic device was manufactured by the same method as that in Example 2 except that the film-shaped resin layer (b) was used instead of the film-shaped resin layer (a) in the resin layer arranging step and then evaluated.

Example 5

Manufacture of Film-Shaped Resin Layer

A film-shaped resin layer (b) was obtained by the same method as that in Example 4.

(Manufacture and Evaluation of Electronic Device)

The film-shaped resin layer (b) formed on the base was laminated on the surface of the circuit substrate on which the bump of the solder 5 was formed by a roll laminator under the conditions of a temperature of 120° C. and a speed of 50 cm/minute. Then, the base peeled off (resin layer arranging step).

Then, the circuit substrate and the semiconductor chip were aligned such that the first terminal of the circuit substrate faced the second terminal of the semiconductor chip, and were heated and compressed by a flip chip bonder (DP-200 manufactured by Shibuya Kogyo Co., Ltd.) at 80° C. and 0.05 MPa for 7 seconds to obtain a laminate (alignment step).

Then, the laminate was heated at 180° C. for 60 minutes in a commercial pressure-responsive oven while a pressing force of 0.5 MPa was applied to the inside of the oven using air (the laminate was pressed at 0.5 MPa) (pressing/curing step).

Then, the laminate was heated and compressed by a flat press (MSA-2 manufactured by System Development Corporation) at 230° C. and 0.2 MPa for 15 seconds to perform soldering (soldering step), thereby manufacturing an electronic device.

Then, the electronic device was evaluated by the same method as that in Example 1.

Example 6

Manufacture of Film-Shaped Resin Layer

A film-shaped resin layer (b) was obtained by the same method as that in Example 4.

(Manufacture and Evaluation of Electronic Device)

The film-shaped resin layer (b) formed on the base was laminated on the surface of the circuit substrate on which the bump of the solder 5 was formed by a roll laminator under the conditions of a temperature of 120° C. and a speed of 50 cm/minute. Then, the base peeled off.

Then, the circuit substrate and the semiconductor chip were aligned such that the first terminal of the circuit substrate faced the second terminal of the semiconductor chip, and were heated and compressed by a flip chip bonder (DP-200 manufactured by Shibuya Kogyo Co., Ltd.) at 80° C. and 0.05 MPa for 7 seconds to obtain a laminate (alignment step).

Then, the laminate was heated at 120° C. for 5 minutes in a commercial pressure-responsive oven while a pressing force of 0.5 MPa was applied to the inside of the oven using air (the laminate was pressed at 0.5 MPa) (first pressing/curing step).

Then, the laminate was heated and compressed by a flat press (MSA-2 manufactured by System Development Corporation) at 230° C. and 0.2 MPa for 15 seconds to perform soldering (soldering step).

Then, the laminate was heated at 180° C. for 60 minutes in the commercial pressure-responsive oven used in the first pressing/curing step while a pressing force of 0.5 MPa was applied to the inside of the oven using air (the laminate was pressed at 0.5 MPa) (second pressing/curing step) to manufacture an electronic device.

Then, the electronic device was evaluated by the same method as that in Example 1.

Example 7

Manufacture of Film-Shaped Resin Layer

A film-shaped resin layer (b) was obtained by the same method as that in Example 4.
(Manufacture and Evaluation of Electronic Device)

The film-shaped resin layer (b) formed on the base was laminated on the surface of the circuit substrate on which the bump of the solder 5 was formed by a roll laminator under the conditions of a temperature of 120° C. and a speed of 50 cm/minute. Then, the base peeled off.

Then, the circuit substrate and the semiconductor chip were aligned such that the first terminal of the circuit substrate faced the second terminal of the semiconductor chip, and were heated and compressed by a flip chip bonder (DP-200 manufactured by Shibuya Kogyo Co., Ltd.) at 80° C. and 0.05 MPa for 7 seconds to obtain a laminate (alignment step).

Then, a flat press was installed in a commercial pressure-responsive oven, and the laminate was attached to the flat press. Then, the laminate started to be heated at 180° C. while a pressing force of 0.5 MPa was applied to the inside of the oven using air (the laminate was pressed at 0.5 MPa). After five minutes had elapsed from heating at 180° C., the laminate was heated and compressed at 180° C. and 0.2 MPa for 15 seconds in a pressurized atmosphere of a pressing force of 0.5 MPa by the flat press which was installed in the pressure-responsive oven and had a press surface at a temperature of 230° C. Then, the heating at 180° C. in the pressurized atmosphere of a pressing force of 0.5 MPa was continued for 60 minutes from the starting of heating at 180° C. (soldering and pressing/curing step) to manufacture an electronic device.

Then, the electronic device was evaluated by the same method as that in Example 1.

In Table 1, soldering is performed at 230° C. and 0.2 MPa for 15 seconds. In the soldering step, the resin layer is also cured.

Example 8

Production of Liquid Resin Composition 70 parts by weight of bisphenol-F epoxy resin EXA-830LVP (manufactured by Dainippon Ink and Chemicals Inc.) as an epoxy resin, 20 parts by weight of PR-53467 (manufactured by Sumitomo Bakelite Co., Ltd.) as a phenol novolac resin, 10 parts by weight of phenolphthalin (manufactured by Tokyo Chemical Industry Co., Ltd.) as a compound having a flux action, and 0.5 parts by weight of 2P4MZ (manufactured by Shikoku Chemicals Corporation) as an imidazole compound were mixed by three rollers to produce a liquid resin composition (c).
(Manufacture and Evaluation of Electronic Device)

An electronic device was manufactured by the same method as that in Example 2 except that the liquid resin composition (c) was applied with a thickness of 35 μm onto the surface of the circuit substrate on which the bump of the solder 5 was formed to form a resin layer, instead of laminating the film-shaped resin layer (b) on the surface of the circuit substrate on which the bump of the solder 5 was formed. Then, the electronic device was evaluated.

Example 9

Production of Resin Varnish 50 parts by weight of cresol novolac-type epoxy resin EOCN-1020-70 (manufactured by Nippon Kayaku Co., Ltd.) as an epoxy resin, 25 parts by weight of PR-53467 (manufactured by Sumitomo Bakelite Co., Ltd.) as a phenol novolac resin, 25 parts by weight of phenolphthalin (manufactured by Tokyo Chemical Industry Co., Ltd.) as a compound having a flux action, and 0.2 parts by weight of 2P4MZ (manufactured by Shikoku Chemicals Corporation) as an imidazole compound were dissolved in ethylene glycol monobutyl ether acetate to produce varnish having a solid content concentration of 80%. The obtained varnish was mixed by three rollers to produce a layer of resin varnish (d).
(Manufacture and Evaluation of Electronic Device)

An electronic device was manufactured by the same method as that in Example 2 except that the resin varnish (d) was applied with a thickness of 35 μm onto the surface of the circuit substrate on which the bump of the solder 5 was formed and was dried at 100° C. for 10 minutes to volatilize a solvent, thereby forming a resin layer, instead of laminating the film-shaped resin layer (b) on the surface of the circuit substrate on which the bump of the solder 5 was formed. Then, the electronic device was evaluated.

Example 10

Manufacture of Film-Shaped Resin Layer

A film-shaped resin layer (a) was obtained by the same method as that in Example 1.
(Manufacture and Evaluation of Electronic Device)

The film-shaped resin layer (a) formed on the base was laminated on the surface of the circuit substrate on which the bump of the solder 5 was formed by a roll laminator under the conditions of a temperature of 120° C. and a speed of 50 cm/minute. Then, the base peeled off (resin layer arranging step).

Then, the circuit substrate and the semiconductor chip were aligned such that the first terminal of the circuit substrate faced the second terminal of the semiconductor chip, and were heated and compressed by a flip chip bonder (DP-200 manufactured by Shibuya Kogyo Co., Ltd.) at 80° C. and 0.05 MPa for 7 seconds to obtain a laminate (alignment step).

Then, the laminate was heated at 180° C. for 60 minutes in a commercial pressure-responsive oven while a pressing force of 0.5 MPa was applied to the inside of the oven using air (the laminate was pressed at 0.5 MPa) (pressing/curing step).

Then, the laminate was heated by a reflow apparatus (NRY325-5Z manufactured by Yamato Works Corporation) and soldering was performed (soldering step), thereby manufacturing an electronic device. That is, the laminate was heated without being compressed to perform soldering. In this case, the heating was performed at a temperature of 150° C. to 180° C. for 90 seconds and then performed at a temperature of 220° C. for 45 minutes.

Then, the electronic device was evaluated by the same method as that in Example 1.

Example 11

Manufacture of Film-Shaped Resin Layer

A film-shaped resin layer (a) was obtained by the same method as that in Example 1.
(Manufacture and Evaluation of Electronic Device)

The film-shaped resin layer (a) formed on the base was laminated on the surface of the circuit substrate on which a solder bump was formed by a roll laminator under the conditions of a temperature of 120° C. and a speed of 50 cm/minute. Then, the base peeled off (resin layer arranging step).

Then, the circuit substrate and the semiconductor chip were aligned such that the first terminal of the circuit substrate faced the second terminal of the semiconductor chip, and were heated and compressed by a flip chip bonder (DP-200 manufactured by Shibuya Kogyo Co., Ltd.) at 80° C. and 0.05 MPa for 7 seconds to obtain a laminate (alignment step).

Then, the laminate was heated at 230° C. for 60 minutes in a commercial pressure-responsive oven while a pressing force of 0.5 MPa was applied to the inside of the oven using air (the laminate was pressed at 0.5 MPa) (soldering and pressing/curing step) to manufacture an electronic device.

Example 12

Manufacture of Film-Shaped Resin Layer

A film-shaped resin layer (a) was obtained by the same method as that in Example 1.
(Manufacture and Evaluation of Electronic Device)

The film-shaped resin layer (a) formed on the base was laminated on the surface of the circuit substrate on which a solder bump was formed by a roll laminator under the conditions of a temperature of 120° C. and a speed of 50 cm/minute. Then, the base peeled off (resin layer arranging step).

Then, the circuit substrate and the semiconductor chip were aligned such that the first terminal of the circuit substrate faced the second terminal of the semiconductor chip, and were heated and compressed by a flip chip bonder (DP-200 manufactured by Shibuya Kogyo Co., Ltd.) at 80° C. and 0.05 MPa for 7 seconds to obtain a laminate (alignment step).

Then, the laminate was heated at 230° C. for 0.5 minutes in a commercial pressure-responsive oven while a pressing force of 0.5 MPa was applied to the inside of the oven using air (the laminate was pressed at 0.5 MPa). Then, the laminate was heated at 180° C. for 60 minutes while a pressing force of 0.5 MPa was applied (the laminate was pressed at 0.5 MPa) (soldering and pressing/curing step) to manufacture an electronic device.

Comparative Example 1

Manufacture of Film-Shaped Resin Layer

A film-shaped resin layer (a) was obtained by the same method as that in Example 1.
(Manufacture and Evaluation of Electronic Device)

The film-shaped resin layer (a) formed on the base was laminated on the surface of the circuit substrate on which a solder bump was formed by a roll laminator under the conditions of a temperature of 120° C. and a speed of 50 cm/minute. Then, the base peeled off.

Then, the circuit substrate and the semiconductor chip were aligned such that the first terminal of the circuit substrate faced the second terminal of the semiconductor chip, and were heated and compressed by a flip chip bonder (DP-200 manufactured by Shibuya Kogyo Co., Ltd.) at 80° C. and 0.05 MPa for 7 seconds.

Then, the circuit substrate and the semiconductor chip were heated and compressed by a flat press (MSA-2 manufactured by System Development Corporation) at 230° C. and 0.2 MPa for 5 seconds to bond the solder bump of the circuit substrate and the Au bump of the semiconductor chip (soldering).

Then, the circuit substrate and the semiconductor chip were heated in a commercial oven at 180° C. for 60 minutes at atmospheric pressure (non-pressing/curing; without applying pressure using a pressurized fluid; pressing force: 0 MPa) to manufacture an electronic device. Then, the electronic device was evaluated by the same method as that in Example 1.

Comparative Example 2

Manufacture and Evaluation of Electronic Device

An electronic device was manufactured by the same method as that in Comparative example 1 except that the heating and compression time in soldering was changed from 5 seconds to 15 seconds and then evaluated by the same method as that in Comparative example 1.

Comparative Example 3

Manufacture and Evaluation of Electronic Device

An electronic device was manufactured by the same method as that in Comparative example 1 except that the heating and compression time in soldering was changed from 5 seconds to 115 seconds and then evaluated by the same method as that in Comparative example 1.

Comparative Example 4

Manufacture of Film-Shaped Resin Layer

A film-shaped resin layer (b) was obtained by the same method as that in Example 4.

(Manufacture and Evaluation of Electronic Device)

The film-shaped resin layer (b) formed on the base was laminated on the surface of the circuit substrate on which a solder bump was formed by a roll laminator under the conditions of a temperature of 120° C. and a speed of 50 cm/minute. Then, the base peeled off.

Then, the circuit substrate and the semiconductor chip were aligned such that the first terminal of the circuit substrate faced the second terminal of the semiconductor chip, and were heated and compressed by a flip chip bonder (DP-200 manufactured by Shibuya Kogyo Co., Ltd.) at 80° C. and 0.05 MPa for 7 seconds.

Then, the circuit substrate and the semiconductor chip were heated in a commercial oven at 180° C. for 60 minutes at atmospheric pressure (non-pressing/curing; without applying pressure using a pressurized fluid; pressing force: 0 MPa).

Then, the circuit substrate and the semiconductor chip were heated and compressed by a flat press (MSA-2 manufactured by System Development Corporation) at 230° C. and 0.2 MPa for 15 seconds to perform soldering, thereby manufacturing an electronic device.

Then, the electronic device was evaluated by the same method as that in Example 1.

Comparative Example 5

Manufacture of Film-Shaped Resin Layer

A film-shaped resin layer (a) was obtained by the same method as that in Example 1.

(Manufacture and Evaluation of Electronic Device)

The film-shaped resin layer (a) formed on the base was laminated on the surface of the circuit substrate on which a solder bump was formed by a roll laminator under the conditions of a temperature of 120° C. and a speed of 50 cm/minute. Then, the base peeled off.

Then, the circuit substrate and the semiconductor chip were aligned such that the first terminal of the circuit substrate faced the second terminal of the semiconductor chip, and were heated and compressed by a flip chip bonder (DP-200 manufactured by Shibuya Kogyo Co., Ltd.) at 80° C. and 0.05 MPa for 7 seconds.

Then, the circuit substrate and the semiconductor chip were heated in a commercial oven at 180° C. for 60 minutes at atmospheric pressure (non-pressing/curing; without applying pressure using a pressurized fluid; pressing force: 0 MPa).

Then, the circuit substrate and the semiconductor chip were heated by a reflow apparatus (NRY325-5Z manufactured by Yamato Works Corporation) and soldering was performed, thereby manufacturing an electronic device. That is, the circuit substrate and the semiconductor chip were heated without being compressed to perform soldering. In this case, the heating was performed at a temperature of 150° C. to 180° C. for 90 seconds and then performed at a temperature of 220° C. for 45 minutes.

Then, the electronic device was evaluated by the same method as that in Example 1.

Comparative Example 6

Comparative example 6 was the same as Example 11 except that the soldering and resin cure step was performed without applying pressure to the laminate.

Comparative Example 7

Comparative example 7 was the same as Example 12 except that the soldering and resin cure step was performed without applying pressure to the laminate.

TABLE 2

|  |  |  |  | Example 1 | Example 2 | Example 3 | Example 4 |
|---|---|---|---|---|---|---|---|
| Mixture [parts by weight] | Thermosetting resin composition | Epoxy resin | EOCN-1020-70 | 45.00 | 45.00 | 45.00 |  |
|  |  |  | EPICLON-840S |  |  |  | 45.00 |
|  |  |  | EXA-830LVP |  |  |  |  |
|  |  | Phenolic resin | RP-53647 | 10.00 | 10.00 | 10.00 | 15.00 |
|  |  | Acrylic rubber | SG-708-6 | 20.00 | 20.00 | 20.00 |  |
|  |  | Acrylic polymer | UC-3900 | 10.00 | 10.00 | 10.00 |  |
|  |  | Phenoxy resin | YP-50 |  |  |  | 25.00 |
|  |  | Phenolphthalin |  | 15.00 | 15.00 | 15.00 | 15.00 |
|  |  | Silane coupling agent | KBM-303 | 0.50 | 0.50 | 0.50 | 0.50 |
|  |  | 2-phenol-4-methyl imidazole | 2P4MZ | 0.01 | 0.01 | 0.01 | 0.01 |
|  |  |  | Total | 100.51 | 100.51 | 100.51 | 100.51 |
| Heating conditions | Alignment |  | Temperature [° C.] | 80 | 80 | 80 | 80 |
|  |  |  | Compression pressure [MPa] | 0.05 | 0.05 | 0.05 | 0.05 |
|  |  |  | Time [sec] | 7 | 7 | 7 | 7 |
|  | Pressing/curing |  | Temperature [° C.] | — | — | — | — |
|  |  |  | Compression pressure [MPa] | — | — | — | — |
|  |  |  | Time [min] | — | — | — | — |
|  | Soldering |  | Temperature [° C.] | 230 | 230 | 230 | 230 |
|  |  |  | Compression pressure [MPa] | 0.2 | 0.2 | 0.2 | 0.2 |
|  |  |  | Time [sec] | 5 | 15 | 115 | 15 |
|  | Pressing/curing |  | Temperature [° C.] | 180 | 180 | 180 | 180 |
|  |  |  | Compression pressure [MPa] | 0.5 | 0.5 | 0.5 | 0.5 |
|  |  |  | Time [min] | 60 | 60 | 60 | 60 |
|  |  | Order of steps |  | Alignment→soldering→pressing/curing | | | |
| Evaluation result |  | Electrical connection |  | ◯ | ◯ | ◯ | ◯ |
|  |  | Absence or presence of microvoids between terminals |  | ◯ | ◯ | ◯ | ◯ |

TABLE 2-continued

| | | | | Example 5 | Example 6 | Example 7 |
|---|---|---|---|---|---|---|
| Mixture [parts by weight] | Thermosetting resin composition | Epoxy resin | EOCN-1020-70 | | | |
| | | | EPICLON-840S | 45.00 | 45.00 | 45.00 |
| | | | EXA-830LVP | | | |
| | | Phenolic resin | RP-53647 | 15.00 | 15.00 | 15.00 |
| | | Acrylic rubber | SG-708-6 | | | |
| | | Acrylic polymer | UC-3900 | | | |
| | | Phenoxy resin | YP-50 | 25.00 | 25.00 | 25.00 |
| | | Phenolphthalin | | 15.00 | 15.00 | 15.00 |
| | | Silane coupling agent | KBM-303 | 0.50 | 0.50 | 0.50 |
| | | 2-phenol-4-methyl imidazole | 2P4MZ | 0.01 | 0.01 | 0.01 |
| | | | Total | 100.51 | 100.51 | 100.51 |
| Heating conditions | Alignment | | Temperature [° C.] | 80 | 80 | 80 |
| | | | Compression pressure [MPa] | 0.05 | 0.05 | 0.05 |
| | | | Time [sec] | 7 | 7 | 7 |
| | Pressing/curing | | Temperature [° C.] | 180 | 120 | — |
| | | | Compression pressure [MPa] | 0.5 | 0.5 | — |
| | | | Time [min] | 60 | 5 | — |
| | Soldering | | Temperature [° C.] | 230 | 230 | 230 |
| | | | Compression pressure [MPa] | 0.2 | 0.2 | 0.2 |
| | | | Time [sec] | 15 | 15 | 15 |
| | Pressing/curing | | Temperature [° C.] | — | 180 | 180 |
| | | | Compression pressure [MPa] | — | 0.5 | 0.5 |
| | | | Time [min] | — | 60 | 60 |
| | | | Order of steps | Alignment→pressing/curing→soldering | Alignment→pressing/curing→soldering→pressing/curing | Alignment→soldering and pressing/curing |
| Evaluation result | | | Electrical connection | ○ | ○ | ○ |
| | | | Absence or presence of microvoids between terminals | ○ | ○ | ○ |

TABLE 3

| | | | | Example 8 | Example 9 | Example 10 |
|---|---|---|---|---|---|---|
| Mixture [parts by weight] | Thermosetting resin composition | Epoxy resin | EOCN-1020-70 | | 50.00 | 45.00 |
| | | | EPICLON-840S | | | |
| | | | EXA-830LVP | 70.00 | | |
| | | Phenolic resin | RP-53647 | 20.00 | 25.00 | 10.00 |
| | | Acrylic rubber | SG-708-6 | | | 20.00 |
| | | Acrylic polymer | UC-3900 | | | 10.00 |
| | | Phenoxy resin | YP-50 | | | |
| | | Phenolphthalin | | 10.00 | 25.00 | 15.00 |
| | | Silane coupling agent | KBM-303 | | | 0.50 |
| | | 2-Phenol-4-methyl imidazole | 2P4MZ | 0.50 | 0.20 | 0.01 |
| | | Ethylene glycol monobutyl ether acetate | | | 25.05 | |
| | | | Total | 100.50 | 125.25 | 100.51 |
| Heating conditions | Alignment | | Temperature [° C.] | 80 | 80 | 80 |
| | | | Compression pressure [MPa] | 0.05 | 0.05 | 0.05 |
| | | | Time [sec] | 7 | 7 | 7 |
| | Pressing/curing | | Temperature [° C.] | — | — | 180 |
| | | | Compression pressure [MPa] | — | — | 0.5 |
| | | | Time [min] | — | — | 60 |
| | Soldering | | Temperature [° C.] | 230 | 230 | Heating condition 1[1)] |
| | | | Compression pressure [MPa] | 0.2 | 0.2 | 0 |
| | | | Time [sec] | 15 | 15 | Heating condition 1[1)] |
| | Pressing/curing | | Temperature [° C.] | 180 | 180 | — |
| | | | Compression pressure [MPa] | 0.5 | 0.5 | — |
| | | | Time [min] | 60 | 60 | — |
| | | | Order of steps | Alignment→soldering→pressing/curing | Alignment→soldering→pressing/curing | Alignment→pressing/curing→soldering |
| Evaluation result | | | Electrical connection | ○ | ○ | ○ |
| | | | Absence or presence of microvoids between terminals | ○ | ○ | ○ |

[1)]heating condition 1: for 90 seconds at 150° C. to 180° C. and for 45 seconds at 220° C.

TABLE 4

| | | | | Comparative example 1 | Comparative example 2 | Comparative example 3 | Comparative example 4 | Comparative example 5 |
|---|---|---|---|---|---|---|---|---|
| Mixture [parts by weight] | Thermosetting resin composition | Epoxy resin | EOCN-1020-70 EPICLON-840S EXA-830LVP | 45.00 | 45.00 | 45.00 | 45.00 | 45.00 |
| | | Phenolic resin | RP-53647 | 10.00 | 10.00 | 10.00 | 15.00 | 10.00 |
| | | Acrylic rubber | SG-708-6 | 20.00 | 20.00 | 20.00 | | 20.00 |
| | | Acrylic polymer | UC-3900 | 10.00 | 10.00 | 10.00 | | 10.00 |
| | | Phenoxy resin | YP-50 | | | | 25.00 | |
| | | Phenolphthalin | | 15.00 | 15.00 | 15.00 | 15.00 | 15.00 |
| | | Silane coupling agent | KBM-303 | 0.50 | 0.50 | 0.50 | 0.50 | 0.50 |
| | | 2-Phenol-4-methyl imidazole | 2P4MZ | 0.01 | 0.01 | 0.01 | 0.01 | 0.01 |
| | | | Total | 100.51 | 100.51 | 100.51 | 100.51 | 100.51 |
| Heating conditions | Alignment | | Temperature [° C.] | 80 | 80 | 80 | 80 | 80 |
| | | | Compression pressure [MPa] | 0.05 | 0.05 | 0.05 | 0.05 | 0.05 |
| | | | Time [sec] | 7 | 7 | 7 | 7 | 7 |
| | Pressing/curing | | Temperature [° C.] | — | — | — | 180 | 180 |
| | | | Compression pressure [MPa] | — | — | — | 0 | 0 |
| | | | Time [min] | — | — | — | 60 | 60 |
| | Soldering | | Temperature [° C.] | 230 | 230 | 230 | 230 | Heating condition 1[1] |
| | | | Compression pressure [MPa] | 0.2 | 0.2 | 0.2 | 0.2 | 0 |
| | | | Time [sec] | 5 | 15 | 115 | 15 | Heating condition 1[1] |
| | Pressing/curing | | Temperature [° C.] | 180 | 180 | 180 | — | — |
| | | | Compression pressure [MPa] | 0 | 0 | 0 | — | — |
| | | | Time [min] | 60 | 60 | 60 | — | — |
| | | | Order of steps | | Alignment→ soldering→ non-pressing/curing | | Alignment→ non-pressing/ curing→ soldering | Alignment→ non-pressing/ curing→ soldering |
| Evaluation result | | | Electrical connection | ○ | ○ | ○ | X | X |
| | | | Absence or presence of microvoids between terminals | X | X | X | X | X |

[1]heating condition 1: for 90 seconds at 150° C. to 180° C. and for 45 seconds at 220° C.

TABLE 5

| | | | | Example 11 | Example 12 | Comparative example 6 | Comparative example 7 |
|---|---|---|---|---|---|---|---|
| Mixture [parts by weight] | Thermosetting resin composition | Epoxy resin | EOCN-1020-70 EPICLON-840S EXA-830LVP | 45.00 | 45.00 | 45.00 | 45.00 |
| | | Phenolic resin | RP-53647 | 10.00 | 10.00 | 10.00 | 10.00 |
| | | Acrylic rubber | SG-708-6 | 20.00 | 20.00 | 20.00 | 20.00 |
| | | Acrylic polymer | UC-3900 | 10.00 | 10.00 | 10.00 | 10.00 |
| | | Phenoxy resin | YP-50 | | | | |
| | | Phenolphthalin | | 15.00 | 15.00 | 15.00 | 15.00 |
| | | Silane coupling agent | KBM-303 | 0.50 | 0.50 | 0.50 | 0.50 |
| | | 2-Phenol-4-methyl imidazole | 2P4MZ | 0.01 | 0.01 | 0.01 | 0.01 |
| | | | Total | 100.51 | 100.51 | 100.51 | 100.51 |
| Heating conditions | Alignment | | Temperature [° C.] | 80 | 80 | 80 | 80 |
| | | | Compression pressure [MPa] | 0.05 | 0.05 | 0.05 | 0.05 |
| | | | Time [sec] | 7 | 7 | 7 | 7 |
| | Soldering and pressing/curing step 1 | | Temperature [° C.] | 230 | 230 | 230 | 230 |
| | | | Compression pressure [MPa] | 0.5 | 0.5 | 0 | 0 |
| | | | Time [sec] | 60 | 0.5 | 60 | 0.5 |
| | Soldering and resin pressing/curing step 1 | | Temperature [° C.] | — | 180 | — | 180 |
| | | | Compression pressure [MPa] | — | 0.5 | — | 0 |
| | | | Time [sec] | — | 60 | — | 60 |
| | | | Order of steps | | Alignment→ soldering and pressing/curing of resin | | Alignment→ soldering and non-pressing/ curing of resin |
| Evaluation result | | | Electrical connection | ○ | ○ | X | X |
| | | | Absence or presence of microvoids between terminals | ○ | ○ | X | X |

In all of Examples 1 to 12, good electrical connection was obtained and no microvoid occurred.

In contrast in Comparative examples 1 to 7, a microvoid occurred and there was a defect in electrical connection.

As can be seen from the comparison between the electronic devices according to Examples 4, 6, and 7 and the electronic device according to Example 5, the spreading of solder in the electronic devices according to Examples 4, 6, and 7 was better than that in the electronic device according to Example 5.

In the measurement of the absence or presence of the microvoid, in all of the electronic devices according to Examples 4 to 7, the microvoid did not occur. However, it was checked whether there was a microvoid between all of the terminals and the check result showed that a very small microvoid occurred in the electronic device according to Example 4. In all of the electronic devices according to Examples 5 to 7, no microvoid occurred. However, the microvoid occurring in Example 4 was smaller than that occurring in Comparative examples 1 to 7 and had a size that did not cause any problem in practical use. In addition, the number of microvoids occurring in Example 4 was smaller than that of the number of microvoids occurring in Comparative examples 1 to 7, which did not cause any problem in practical use.

In Examples 1 to 12, a pressing force of 0.5 MPa was applied to the resin layer when the resin layer was cured. However, when a pressing force of 10 MPa was applied, the same effect was obtained.

In all of Examples 1 to 12, the resin layer having a flux action included an epoxy resin. However, it was confirmed that, when the resin layer included thermosetting resins (for example, an oxetane resin) other than the epoxy resin, the occurrence of voids was prevented, similar to Examples 1 to 12.

The minimum melt viscosity of the resin layer used in Examples 1 to 12 at a temperature of 100° C. to 200° C. was 2 Pa·s.

The minimum melt viscosity was measured by a rheometer, which was a viscoelastic measuring device, by applying a shear frequency of 1 Hz to a film-shaped sample at a rate of temperature increase of 10° C./minute.

When the resin layer was a liquid resin composition, a solvent was dried to form a resin film and then the minimum melt viscosity of the resin film was measured.

Example 13

Manufacture of Film-Shaped Resin Layer 45 parts by weight of cresol novolac-type epoxy resin EOCN-102070 (manufactured by Nippon Kayaku Co., Ltd.) as an epoxy resin, 15 parts by weight of PR-53467 (manufactured by Sumitomo Bakelite Co., Ltd.) as a phenol novolac resin, 15 parts by weight of YP-50 (manufactured by Tohto Kasei Co., Ltd.) as a phenoxy resin, 15 parts by weight of phenolphthalin (manufactured by Tokyo Chemical Industry Co., Ltd.) as a compound having a flux action, 1.0 parts by weight of KBM-303 (manufactured by Shin-Etsu Silicon Co., Ltd.) as a silane coupling agent, and 0.05 parts by weight of 2P4MZ (manufactured by Shikoku Chemicals Corporation) as an imidazole compound were dissolved in acetone, and 10 parts by weight of filler (SE6050 manufactured by Admatechs Co., Ltd.; an average particle diameter: 2 μm) was added to produce a varnish resin composition.

The obtained varnish resin composition was applied onto a polyester sheet (base) by a comma coater and was dried at a temperature of 100° C. at which the acetone was volatilized for 3 minutes to obtain a film-shaped resin layer with a thickness of 35 μm on the base.

(Manufacture of Electronic Device)

The film-shaped resin layer formed on the base was used to manufacture an electronic device by the same method as that in Example 1.

(Evaluation of Electronic Device)

The electronic device obtained in Example 1 was evaluated by the same method as that in Example 1.

Example 14

Manufacture of Film-Shaped Resin Layer

A resin layer was manufactured by the same method as that in Example 13 except that a filler (SE6050 manufactured by Admatechs Co., Ltd.; an average particle diameter: 2 μm) was added to the resin layer according to Example 13 and 30 parts by weight of varnish resin composition was added.

Then, an electronic device was manufactured by the same method as that in Example 13 and was evaluated by the same method as that in Example 1.

Example 15

Manufacture of Film-Shaped Resin Layer

A resin layer was manufactured by the same method as that in Example 13 except that a filler (SE6050 manufactured by Admatechs Co., Ltd.; an average particle diameter: 2 μm) was added to the resin layer according to Example 13 and 60 parts by weight of varnish resin composition was added.

Then, an electronic device was manufactured by the same method as that in Example 13 and was evaluated by the same method as that in Example 1.

Compositions of the resin layers used in Examples 13 to 15 are shown in Table 6.

TABLE 6

| | | | | Example 13 | Example 14 | Example 15 |
|---|---|---|---|---|---|---|
| Mixture [parts by weight] | Thermosetting resin composition | Epoxy resin | EOCN-1020-70 | 45.00 | 45.00 | 45.00 |
| | | Phenolic resin | RP-53647 | 15.00 | 15.00 | 15.00 |
| | | Phenoxy resin | YP-50 | 15.00 | 15.00 | 15.00 |
| | | Phenolphthalin | | 15.00 | 15.00 | 15.00 |
| | | Silane coupling agent | KBM-303 | 1.00 | 1.00 | 1.00 |
| | | 2-Phenol-4-methyl imidazole | 2P4MZ | 0.05 | 0.05 | 0.05 |
| | | Filler | SE6050 | 10.00 | 30.00 | 60.00 |
| | | | Total | 101.5 | 121.05 | 151.05 |
| | | Minimum melt viscosity (Pa · s) at 100° C. to 200° C. | | 5 | 100 | 3300 |

The minimum melt viscosity of the resin layer used in Example 13 at a temperature of 100° C. to 200° C. was 5 Pa·s. The minimum melt viscosity of the resin layer used in Example 14 at a temperature of 100° C. to 200° C. was 100 Pa·s. The minimum melt viscosity of the resin layer used in Example 15 at a temperature of 100° C. to 200° C. was 3300 Pa·s.

The minimum melt viscosity was measured by a rheometer, which was a viscoelastic measuring device, by applying a shear frequency of 1 Hz to a film-shaped sample at a rate of temperature increase of 10° C./minute.

In Examples 13 to 15, a microvoid and a defect in electrical connection did not occur.

In Examples 13 to 15 in which the resin layer with a minimum melt viscosity more than that in Example 1 was used, it was possible to reliably prevent the occurrence of a microvoid.

The invention claimed is:

1. A method of manufacturing an electronic device comprising a first electronic component having a first terminal and a second electronic component having a second terminal, wherein said first electronic component is electrically connected to said second electronic component by connecting said first terminal to said second terminal with solder,
    the method comprising:
        providing a resin layer having a flux action between said first terminal and said second terminal to obtain a laminate including said first electronic component, said second electronic component, and said resin layer, wherein a solder is provided on said first terminal or said second terminal;
        soldering said first terminal and said second terminal; and
        curing said resin layer while pressing said laminate with a pressurized fluid.

2. The method of manufacturing an electronic device according to claim 1,
    wherein, after said curing of said resin layer, said cured resin layer is again cured while said laminate is pressed by said pressurized fluid.

3. The method of manufacturing an electronic device according to claim 1,
    wherein said first terminal and said second terminal are soldered while said laminate is pressed by said pressurized fluid and said resin layer is cured to perform said soldering of said first terminal and said second terminal and said curing of said resin layer.

4. The method of manufacturing an electronic device according to claim 1,
    wherein, in said curing of said resin layer, said laminate is placed in a vessel and said pressurized fluid is introduced into said vessel to press said laminate.

5. The method of manufacturing an electronic device according to claim 1,
    wherein said pressurized fluid is gas.

6. The method of manufacturing an electronic device according to claim 5,
    wherein said pressurized fluid is air.

7. The method of manufacturing an electronic device according to claim 1,
    wherein, in said curing of said resin layer, a pressure equal to or more than 0.1 MPa and equal to or less than 10 MPa is applied to said laminate by said pressurized fluid.

8. The method of manufacturing an electronic device according to claim 1,
    wherein the minimum melt viscosity of said resin layer at a temperature of 100° C. to 200° C. is in the range of 1 Pa·s to 10000 Pa·s.

9. The method of manufacturing an electronic device according to claim 1,
    wherein said resin layer includes a thermosetting resin.

10. The method of manufacturing an electronic device according to claim 1,
    wherein said resin layer includes a resin (A) having at least one phenolic hydroxyl group and a resin (B) serving as a curing agent of the resin (A).

* * * * *